(12) United States Patent
Lesso et al.

(10) Patent No.: US 12,253,487 B2
(45) Date of Patent: *Mar. 18, 2025

(54) CIRCUITRY FOR ANALYTE MEASUREMENT

(71) Applicant: Cirrus Logic International Semiconductor Ltd., Edinburgh (GB)

(72) Inventors: John Paul Lesso, Edinburgh (GB); Toru Ido, Tokyo (JP)

(73) Assignee: Cirrus Logic Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/685,979

(22) PCT Filed: Aug. 25, 2022

(86) PCT No.: PCT/GB2022/052184
§ 371 (c)(1),
(2) Date: Feb. 23, 2024

(87) PCT Pub. No.: WO2023/031582
PCT Pub. Date: Mar. 9, 2023

(65) Prior Publication Data
US 2024/0264112 A1    Aug. 8, 2024

Related U.S. Application Data

(63) Continuation of application No. 17/463,796, filed on Sep. 1, 2021, now Pat. No. 11,846,600.

(51) Int. Cl.
*G01N 27/327* (2006.01)
*G01R 19/165* (2006.01)

(52) U.S. Cl.
CPC ....... *G01N 27/3273* (2013.01); *G01R 19/165* (2013.01); *G01R 19/16566* (2013.01)

(58) Field of Classification Search
None
See application file for complete search history.

(56) References Cited

U.S. PATENT DOCUMENTS

| | | | |
|---|---|---|---|
| 6,366,794 | B1 | 4/2002 | Moussy et al. |
| 10,756,745 | B2 | 8/2020 | Dastgheib et al. |
| 2005/0252777 | A1 | 11/2005 | Li |
| 2005/0265094 | A1 | 12/2005 | Harding et al. |
| 2007/0163894 | A1 | 7/2007 | Wang et al. |
| 2010/0213079 | A1 | 8/2010 | Willis |
| 2010/0300899 | A1 | 12/2010 | Levine et al. |

(Continued)

OTHER PUBLICATIONS

International Search Report and Written Opinion of the International Search Authority, International Application No. PCT/GB2022/052184, mailed Nov. 16, 2022.

(Continued)

*Primary Examiner* — J. Christopher Ball
(74) *Attorney, Agent, or Firm* — Jackson Walker L.L.P.

(57) ABSTRACT

Circuitry for and methods of analyte measurement Circuitry for measuring a characteristic of an electrochemical cell, the circuitry comprising: a hysteretic comparator having a first comparator input, a second comparator input and a comparator output; a feedback path between the comparator output and the second comparator input configured to provide a feedback signal to the second comparator input; and a loop filter configured to apply filtering to the feedback path to generate the feedback signal, wherein the loop filter comprises the electrochemical cell.

28 Claims, 20 Drawing Sheets

(56) References Cited

U.S. PATENT DOCUMENTS

| | | |
|---|---|---|
| 2014/0021064 A1 | 1/2014 | Pratt et al. |
| 2014/0266015 A1 | 9/2014 | Newlin |
| 2014/0375463 A1 | 12/2014 | Duric |
| 2015/0341046 A1 | 11/2015 | Schinkel et al. |
| 2018/0219557 A1 | 8/2018 | Dastgheib et al. |
| 2019/0004000 A1 | 1/2019 | Jang et al. |
| 2019/0029577 A1 | 1/2019 | Koelker et al. |
| 2019/0068215 A1 | 2/2019 | Lesso |
| 2019/0199359 A1 | 6/2019 | Lesso |
| 2024/0068980 A1 | 2/2024 | Lesso et al. |

OTHER PUBLICATIONS

Akram et al., An Amplifier—Less CMOS Potentiostat IC Consuming 3.7nW Power all over 129.5dB Dynamic Range for Electrochemical Biosensing, ISSCC 2024/Session 3/Analog Techniques/3.6, Feb. 19, 2024.

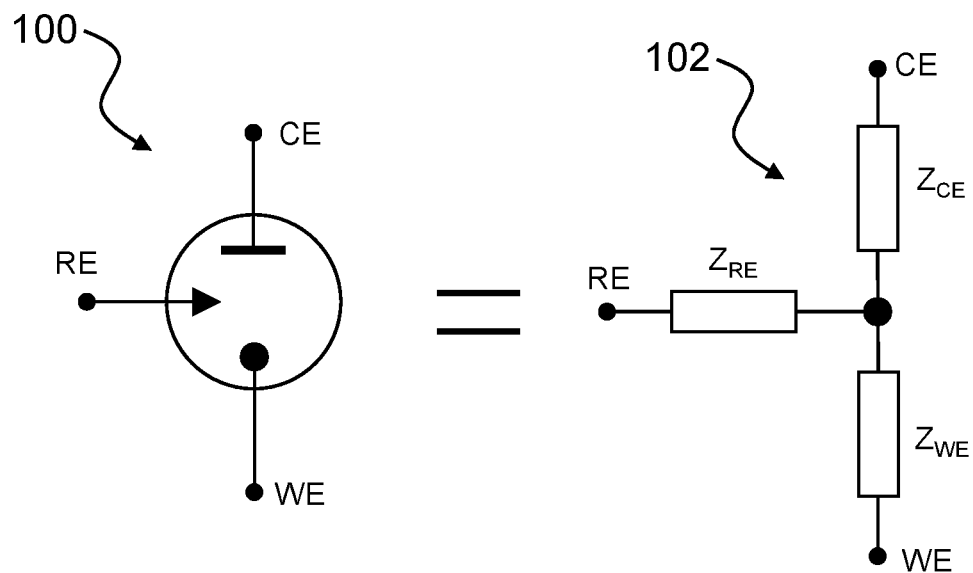
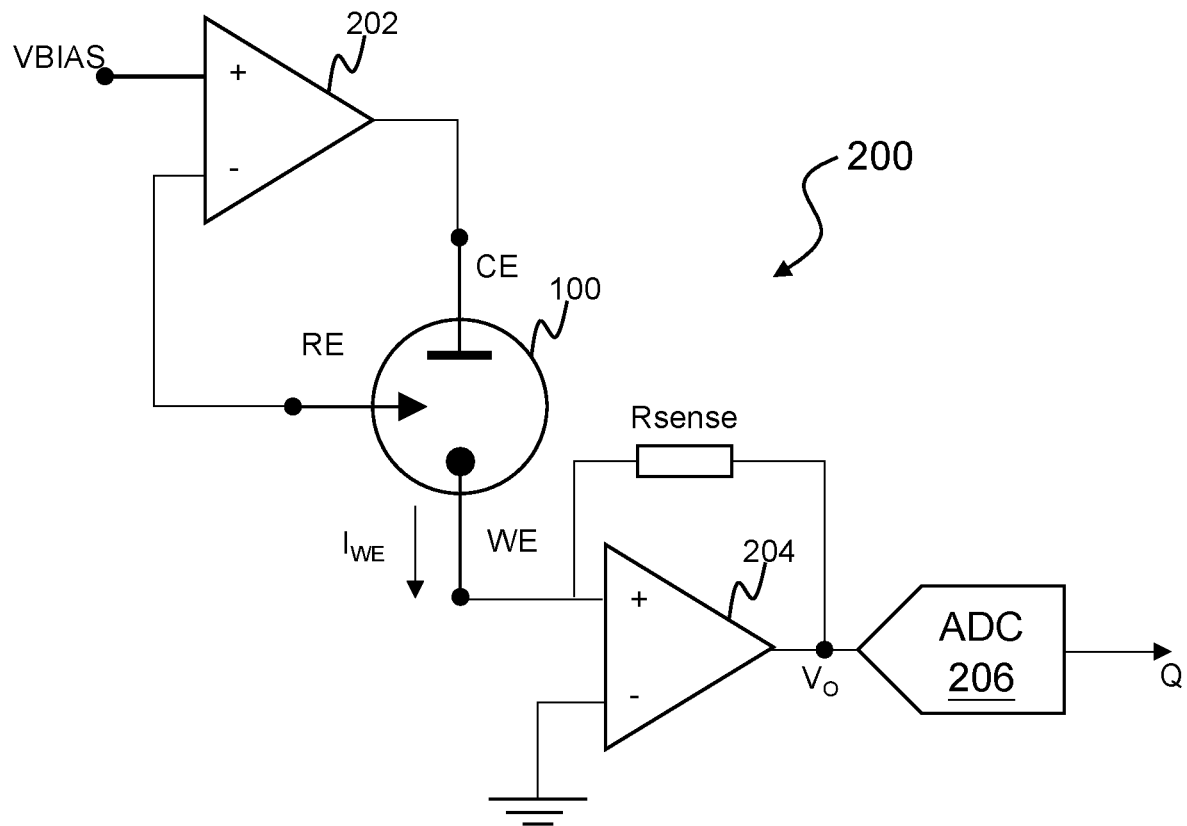
Fig. 1
Fig. 2 (prior art)

CIRCUITRY FOR ANALYTE MEASUREMENT

The present application is a 371 of International Patent Application No. PCT/GB2022/052184, filed Aug. 25, 2022, which claims priority to U.S. patent application Ser. No. 17/463,796, filed Sep. 1, 2021, each of which is incorporated by reference herein in its entirety.

TECHNICAL FIELD

The present disclosure relates to circuitry for measuring characteristics in electrochemical sensors.

BACKGROUND

Electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes.

Conventional drive and measurement circuitry in electrochemical sensors comprises several amplifiers, feedback and/or feedback loops in addition to other processing circuitry, such as analog-to-digital converters (ADCs). Such circuitry can take up a large amount of space on-chip, as well as being relatively process intensive, thereby utilising large amounts of power. When electrochemical sensors are battery powered, for example when used in continuous glucose monitoring, it is desirable for such sensors to be as small as possible and use as little power as possible.

SUMMARY

Embodiments of the disclosure aim to address or at least ameliorate one or more of the above issues by reducing the overall power and size of the drive and measurement circuitry required to measure analyte concentration in electrochemical sensors. Specifically, embodiments of the disclosure utilise the filtering characteristics of the electrochemical cell as the filter in a pulse-width-modulation (PWM) circuit, thus saving both power and space. By reducing the size and power of drive and measurement circuitry, multiple electrochemical sensors can be integrated into a single device, thereby either providing redundancy or enabling the sensing of multiple analytes in a single chip. Multiple analyte sensors may be particularly advantageous in applications such as continuous glucose monitoring, where it may be desirable to measure concentrations of glucose, ketones, oxygen, lactate, and the like.

According to a first aspect of the disclosure, there is provided circuitry for measuring a characteristic of an electrochemical cell, the circuitry comprising: a comparator having a first comparator input, a second comparator input and a comparator output; a feedback path between the comparator output and the second comparator input configured to provide a feedback signal to the second comparator input; and a loop filter configured to apply filtering to the feedback path to generate the feedback signal, wherein the loop filter comprises the electrochemical cell.

The comparator may be a hysteretic comparator. The hysteretic comparator may be hysteretic in voltage or hysteretic in time.

The electrochemical cell may comprise at least one working electrode, a counter electrode and a reference electrode. The comparator output may be coupled to the counter electrode. The reference electrode may be coupled to the second comparator input.

The electrochemical cell may comprise at least one working electrode and a counter electrode. The comparator output may be coupled to the counter electrode via a first impedance. The counter electrode may be coupled to the second comparator input.

The first impedance may be provided by an inductor. Alternatively, the first impedance may be provided by a current digital to analog converter (IDAC). The IDAC may be provided in series between the comparator output and the counter electrode. The IDAC may be unipolar or bipolar. Alternatively, the first impedance may be provided by a finite impulse response digital to analog converter (FIR DAC).

The circuitry may further comprise a sample and hold circuit coupled between the comparator output and the first impedance.

The circuitry may further comprise control circuitry configured to adapt a hysteresis of the comparator based on a limit cycle frequency or limit cycle period of a comparator output signal derived from the comparator output.

The circuitry may further comprise decoding circuitry configured to decimate the comparator output signal and output a data signal.

The decoding circuitry may be further configured to determine the limit cycle frequency of the limit cycle period and output the limit cycle frequency or the limit cycle period to the control circuitry.

The control circuitry may be further configured to estimate a load capacitance of the electrochemical cell based on the limit cycle frequency or the limit cycle period.

The circuitry may further comprise an external capacitor coupled between the counter electrode and the working electrode.

The at least one working electrode may be coupled to a reference voltage, which may be variable.

The circuitry may further comprise a multiplexer configured to switchably coupled a reference voltage between the counter electrode and the one or more additional counter electrodes.

The circuitry may further comprise one or more additional counter electrodes. In which case, the circuitry may further comprise an additional comparator for each of the one or more additional counter electrodes, each additional comparator comprising an additional first comparator input, an additional second comparator input and an additional comparator output. An additional feedback path may be provided between each additional comparator output and each additional second comparator input, configured to provide an additional feedback signal to a respective additional second comparator input. Each additional comparator output may be coupled to a respective additional counter electrode.

The circuitry may further comprise one or more additional working electrodes.

The circuitry may further comprise a multiplexer configured to switchably coupled a reference voltage between the working electrode and the one or more additional working electrodes.

The circuitry may further comprise: an additional hysteretic comparator for each of the one or more additional working electrodes, each additional hysteretic comparator comprising an additional first comparator input, an additional second comparator input and an additional comparator output; an additional feedback path between each additional comparator output and each additional second comparator input configured to provide an additional feedback signal to a respective additional second comparator input, wherein each additional comparator output is coupled to a respective additional working electrode.

The comparator and each additional comparator may be hysteretic. Hysteretic switching of the comparator and each additional comparator may be controlled to minimise interference between the comparator output and each additional comparator output. Controlling the hysteretic switching may comprise staggering hysteretic switching of the comparator and each additional comparator.

The working electrode or counter electrode and each additional working electrode or counter electrode may each be configured to sense a different analyte. In other words, the electrochemical cell may be configured to sense a plurality of different analytes. As such, the circuitry may be configured to measure concentrations of multiple analytes at the same time. The different analytes may be selected from a non-exhaustive list comprising two or more of glucose, lactates and ketones. These analytes are of particular interest in the monitoring and treatment of diabetes.

The comparator may be synchronous or asynchronous.

In embodiments in which the comparator is asynchronous, the circuitry may further comprise a counter, the comparator output coupled to a data input of the counter. To reduce quantization error associated with the counter, the circuitry may further comprise a voltage-controlled oscillator (VCO) arranged between the comparator output and the data input of the counter.

Bias circuitry may be provided for applying a bias voltage to the first comparator input. The bias circuitry may comprise a filter configured to receive an input voltage and generate the bias voltage.

The filter may comprise an integrator having a first integrator input for receiving the input voltage, a second integrator input and an integrator output. The integrator output may be coupled to the first comparator input and to the first integrator input via a first capacitance. The second integrator input may be coupled to the second comparator input.

The bias voltage may be controlled to vary the limit cycle frequency. The limit cycle may be controlled so as to provide an alternating current (AC) at the comparator output. The limit cycle may be controlled so as to provide a sinusoidal signal at the comparator output.

The circuitry may further comprise hold circuitry configured to hold an electrode of the electrochemical cell at a predetermined voltage. The hold circuitry may be further configured to power down the comparator when the electrode of the electrochemical cell is held at a predetermined voltage.

In some embodiments, chopping may be used to stabilise the circuitry against drift (or DC bias) of components thereof. For example, a polarity of the comparator may be inverted on every other switching cycle of the comparator. The chopping (such as the inversion of the polarity of the comparator) may be synchronised with a rising edge or a falling edge of an output signal at the comparator output. Preferably, chopping is synchronised with a falling edge of the output signal.

According to another aspect of the disclosure, there is provided an electronic device comprising the circuitry described above. The electronic device may be continuous glucose monitor. The device may comprise one of a mobile computing device, a laptop computer, a tablet computer, a games console, a remote control device, a home automation controller or a domestic appliance, a toy, a robot, an audio player, a video player, or a mobile telephone, and a smartphone.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which:

FIG. 1 illustrates a schematic diagram and electrical equivalent circuit for a three-electrode electrochemical cell;

FIG. 2 is a schematic diagram of an example prior art measurement circuit;

DESCRIPTION OF EMBODIMENTS

Figure 3:
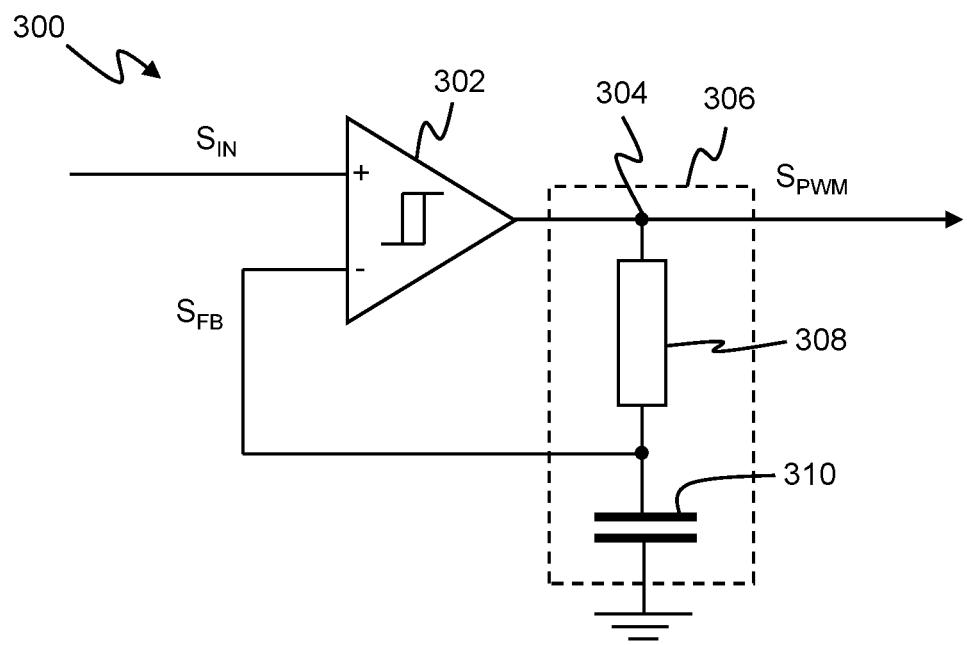
FIG. 3 is a schematic diagram of a pulse width modulation (PWM) circuit.

FIG. 1 is a schematic diagram of an electrochemical cell 100 comprising three electrodes, namely a counter electrode CE, a working electrode WE and a reference electrode RE. FIG. 1 also shows an equivalent circuit 102 for the electrochemical cell comprising a counter electrode inductance ZCE, a working electrode inductance ZWE and a reference electrode inductance ZRE.

To determine a characteristic of the electrochemical cell, and therefore an analyte concentration, a measurement current is injected at the counter electrode CE and a current at the working electrode is measured. The reference electrode RE is used to measure a voltage drop between the working electrode WE and the reference electrode RE. The measurement current is then adjusted to keep voltage drop constant. As the resistance in the cell 100 increases, the voltage drop measured at the reference electrode increases. In response, the measurement current injected at the counter electrode CE is decreased. Likewise, as the resistance in the cell 100 decreases, the voltage drop measured at the reference electrode decreases. In response, the measurement current injected at the counter electrode CE is increased. Thus the electrochemical cell 100 reaches a state of equilibrium where the voltage drop between the reference electrode RE and the working electrode WE is maintained constant. Since the current injected at the counter electrode CE and the voltage drop are known, the resistance of the cell 100 can be ascertained.

FIG. 2 illustrates an example prior art drive and measurement circuit 200 which is configured to implement the above explained cell characterisation, specifically for measuring an analyte concentration in the electrochemical cell 100 shown in FIG. 1. The circuit 200 comprises a comparator 202 and a non-inverting op-amp 204. A non-inverting input of the comparator 202 is coupled to a bias voltage VBIAS. An inverting input of the comparator 202 is coupled to the reference electrode RE. An output of the comparator is coupled to the counter electrode CE and configured to inject the measurement current. The measurement current injected at the counter electrode CE by the comparator 202 is proportional to the difference between the bias voltage VBIAS and the voltage at the reference electrode RE. As such, the comparator acts to maintain the voltage between the reference electrode RE and the working electrode WE close to the bias voltage VBIAS. A non-inverting input of the op-amp 204 is coupled to the working electrode WE and the inverting input of the op-amp 204 is coupled to a reference voltage, in this case ground. A feedback loop comprising a sense resistor RSENSE is coupled between the non-inverting input and an output of the op-amp 204. The op-amp 204 is thus operable to output a voltage VO which is proportional to the current IWE at the working electrode WE. The output voltage VO is then provided to an analog-to-digital converter (ADC) 206 which outputs a digital output Q which represents the current IWE at the working electrode WE.

It can be seen that the conventional drive and measurement circuit 200 shown in FIG. 2 comprises two op-amps and an ADC. Each of these components not only takes up space on-chip but also consumes a relatively large amount of power.

As mentioned above, embodiments of the disclosure aim to address or at least ameliorate one or more of the above issues by reducing the overall power and size of the drive and measurement circuitry required to measure analyte concentration in electrochemical sensors. Specifically, embodiments of the disclosure utilise the inductive nature and filtering characteristics of the electrochemical cell to act as a filter in a pulse-width-modulation (PWM) circuit, thus saving both power and space.

FIG. 3 is a schematic diagram of a PWM circuit 300, also known as a time encoding machine.

Generally, the PWM circuit 300 is configured to receive an input signal SIN, which may for instance be a bias voltage, and generate a pulse-width modulation (PWM) signal SPWM that alternates between different signal levels to encode the difference between the signal level of the input signal SIN and the signal level of the feedback signal SFB by the proportion of time spent in each output state. Typically the PWM signal SPWM may swap between first and second output states and the signal level of the input signal may be encoded by the duty cycle of a first output state, i.e. the proportion of the overall cycle period that corresponds to the first output state, or equivalently the amount of time that the PWM signal SPWM spends in the first output state compared to the second output state.

The PWM circuit 300 comprises a hysteretic comparator 302. In this embodiment the hysteretic comparator 302 is arranged to receive the input signal SIN at a first comparator input, in this example input (+). The hysteretic comparator 302 compares the input signal SIN at the first comparator input with a feedback signal SFB received at a second comparator input, in this example input (−), and applies hysteresis to the comparison to generate the PWM signal SPWM at a comparator output node 304. A feedback path also extends from the comparator output node 304 to the second comparator input, in this example input (−), for providing the feedback signal SFB to the second comparator input. A loop filter arrangement 306 is arranged to apply filtering to the feedback path to provide the feedback signal SFB. In this embodiment the loop filter arrangement 306 comprises a resistive-capacitive (RC) filter having an impedance 308 in the feedback path and a capacitance 310 coupled between the feedback path and a reference voltage, e.g. ground.

The hysteretic comparator 302 compares the signals at the first and second comparator inputs, i.e. the input signal SIN and the feedback signal SFB, and outputs either of two output states, VH and VL, depending on the result of the comparison. The hysteretic comparator 302 is operable to apply hysteresis to the comparison such that a differential voltage between the signals SIN and SFB at the first and second comparator inputs must be greater (i.e. more positive or less negative) than a first threshold to transition from one output state to the other, say from output state VL to the output state VH, but must be lower (i.e. less positive or more negative) than a second, different threshold to make the opposite transition, e.g. to swap from the output state VH to the output state VL. The difference between these first and second thresholds corresponds to the amount of hysteresis applied. In some implementations the first and second thresholds may be equal in magnitude and opposite in polarity, i.e. the difference between the input signal SIN and the feedback signal SFB must be greater than an amount +H to transition to one state, say VH, and must be lower than −H to transition to the other state, say VL. In this instance the magnitude of H can be seen as a measure of the hysteresis applied by the hysteretic comparator 302 and the hysteresis applied is symmetric. It will be understood however that the hysteresis applied could be asymmetric in some implementations.

In some embodiments the output states VH and VL may be high and low voltage levels respectively, for instance a supply voltage VDD (VH) and ground (VL), or a positive voltage V+ (VH) and a negative voltage V− (VL), possibly of equal magnitude. Thus the PWM signal SPWM transitions between two output voltage states.

The input signal SIN is thus compared to the feedback signal SFB which is derived from the output PWM signal SPWM. The feedback signal SFB corresponds to a filtered version of the PWM signal SPWM and the filter arrangement 306 provides some delay and signal averaging over time. Thus if the PWM signal SPWM transitions to the high state VH, the feedback signal SFB will, initially, be lower than the present state of the PWM signal SPWM and will begin to increase, i.e. become more positive, over a period of time. The delay and signal averaging applied to the PWM signal SPWM is thus dependent on the characteristics of the filter arrangement 306 and any changes in the characteristics of the filter arrangement 306 will lead to a change in the feedback signal SFB. This phenomenon is the basis of operation of the PWM circuit 300 for the measurement of characteristics of the electrochemical cell 100, as will be described in more detail below.

If the input signal SIN itself is constant over that period of time and the filter characteristic of the filter arrangement 306 is also constant, the difference between the input signal SIN and the feedback signal SFB will decrease, i.e. become less positive/more negative, until the relevant threshold is reached and the PWM signal SPWM transitions to the other output state VL. At this point the value of the feedback signal SFB will start to decrease. The hysteretic comparator 302 will maintain the low state VL until the difference between the input signal SIN and the feedback signal SFB increases, i.e. becomes less negative/more positive, to the second threshold.

Note that the arrangement illustrated in FIG. 3 assumes that the input signal SIN and the feedback signal SFB are in a range within the voltage range of the output state VH and VL and are referenced to a midpoint voltage VMID which is equal to the midpoint voltage between VH and VL. If necessary, level shifting and/or scaling could be applied to at least one of the input signal SIN or feedback signal SFB.

Thus if the input signal SIN and the feedback signal SFB maintain a constant level, the output of the hysteretic comparator 302 will continually cycle between the first and second output states VH and VL. The time spent in each output state will depend on how long it takes for the feedback signal SFB to change by the amount defined by the hysteresis, e.g. from a value equal to SIN−H to a value SIN+H or vice versa. This will depend on the amount of hysteresis and the rate of change of the feedback signal SFB, which itself is dependent on the filter characteristic of the filter arrangement 306. However the rate of change of the feedback signal SFB will depend on the then-current value of the feedback signal SFB, in particular the difference between the level of the output state, i.e. VH or VL, and the value of the feedback signal SFB, which in turn depends on the level of the input signal SIN and the characteristics of the filter arrangement 306.

The duration of a pulse corresponding to the high state VH in the PWM signal SPWM (and correspondingly the duration of a pulse corresponding to the low state VL in the PWM signal SPWM) thus depends on the level of the input signal SIN and the characteristics of the filter arrangement 306. Where the input signal SIN is constant, the PWM encodes the filter characteristics of the filter arrangement 306 as the duty cycle of the PWM signal SPWM, i.e. the ratio between the duration of a pulse of a first output state, say VH, to the duration of the cycle period.

Figure 4:
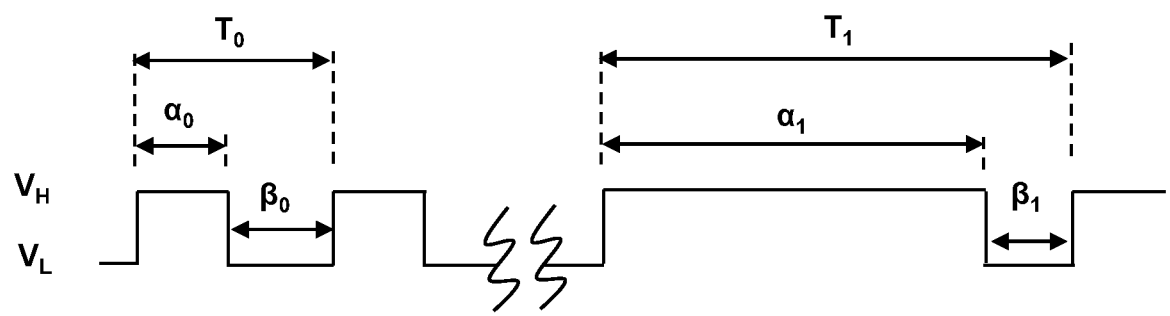
FIG. 4 is a timing diagram for a PWM signal.

FIG. 4 illustrates the principles of the PWM signal SPWM of the PWM circuit 300 shown in FIG. 2. The PWM signal SPWM varies between the two output states VH and VL. The duration of a pulse of the high state VH is denoted by α and the duration of a pulse of the low state VL is denoted by β. The cycle period T is equal to α+β. For cycles which do not correspond to duty cycles of 100% or 0% the cycle period T can also be seen as the period between an instance of a transition from one output state to the other output state and the next instance of the same transition.

As described above the duration α of the pulse of the high state VH depends on the level of the input signal SIN and the characteristics of the filter arrangement 306, as does the duration of the pulse of the low state VL. For signals of zero magnitude (which corresponds to a signal reference voltage value equal to the midlevel voltage VMID between VH and VL) the periods of the pulses of each state, illustrated in FIG. 4 as α0 and β0, will be equal to one another, i.e. each equal to T0/2 where T0 is the cycle period at zero magnitude. If the delay in the filter arrangement 306 increases, the duration of the pulse of one state will increase and the duration of the pulse of the other state will decrease.

Thus any increase in the delay of the filter arrangement 306 will result in an increase in the cycle period, as illustrated by the durations α1 and β1 and duration T1 for a cycle period at a non-zero input signal magnitude. Thus the cycle period T0 (equal to α0+β0) corresponding to an input signal of zero magnitude will be the cycle period of shortest duration. This condition is referred to as the limit cycle and the period T0 is the limit cycle period. This corresponds to the fastest cycle frequency f0=1/T0 which is referred to as the limit cycle frequency.

Embodiments of the present disclosure at least partially replace the filter arrangement 306 shown in FIG. 3 with an electrochemical cell, such as the cell 100 shown in FIG. 1. The electrochemical cell acts as a filter having an RC characteristic. With the input signal Sin set to a constant bias voltage VBIAS, changes in the impedance characteristic of the cell 100 are translated to changes in the cycle period of the PWM signal SPWM.

Figure 5A:
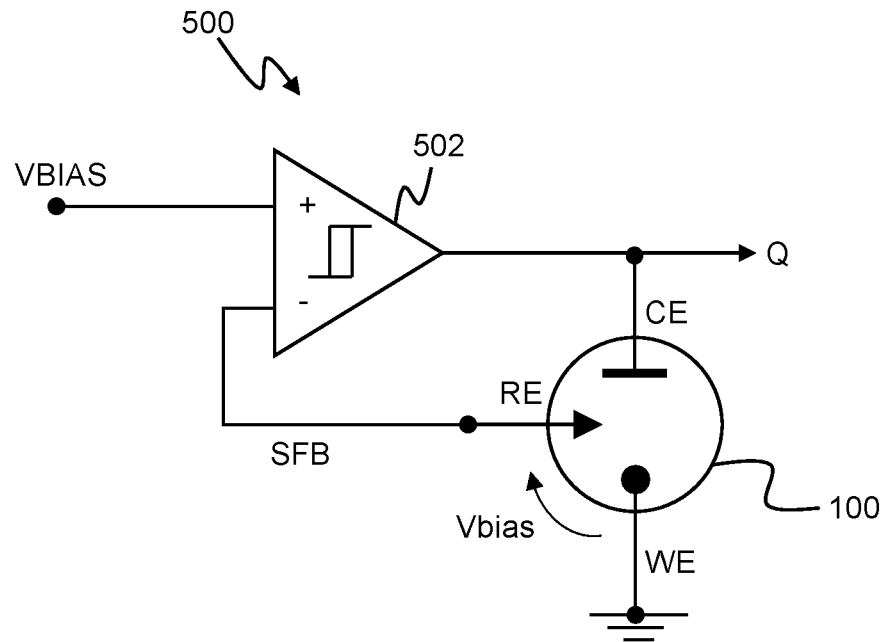
FIG. 5A is a schematic diagram of a measurement circuit for measuring characteristics of an electrochemical cell.
Figure 6:
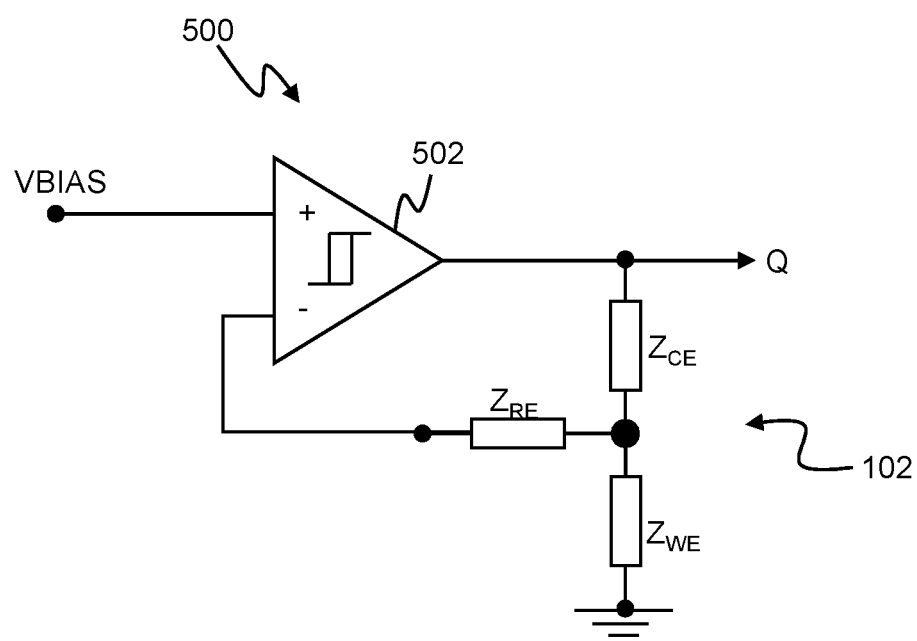
FIG. 6 is a schematic diagram of a measurement circuit for measuring characteristics of an electrical equivalent of the electrochemical cell shown in FIG. 5.

FIGS. 5A and 6 respectively show an exemplary measurement circuit 500 comprising the electrochemical cell 100 of FIG. 1 and the same measurement circuit 500 with the equivalent impedance circuit 102, also shown in FIG. 1. The circuit 500 comprises a hysteretic comparator 502 and the electrochemical cell 100. A bias voltage VBIAS is provided to a first (e.g., non-inverting input) of the comparator 502. An output of the comparator 502 is coupled to the counter electrode CE of the cell 100 as well as being provided as an output of the circuit 500. The working electrode of the cell 100 is coupled to a reference voltage, in this case ground GND. The reference electrode RE is coupled to a second (e.g. inverting) input of the comparator 502. It can be seen that, in this arrangement, the electrochemical cell 100 forms a filter in the feedback path between the output and a first input (in this case inverting) of a hysteretic comparator 502. A second input (in this case non-inverting) is coupled to a known bias voltage VBIAS. Since the bias voltage is known, the PWM output Q is encoded by the impedances ZRE, ZCE, ZWE of the electrochemical cell 100.

In the embodiment shown in FIGS. 5A and 6 (as well as other embodiments described throughout this application) the voltage difference between the counter electrode CE and the working electrode WE is positive (i.e. the voltage at the working electrode WE, ground, is less than that at the counter electrode CE). In some embodiments, however, it may be advantageous to reverse the bias between the counter electrode CE and the working electrode. For example, for an oxygen based sensor implemented as the cell 100, the voltage at the working electrode WE should be below the voltage at the reference electrode RE. In contrast, for a hydrogen peroxide (H2O2) sensor, the voltage at the working electrode WE should be above the voltage at the reference electrode RE.

Figure 5B:
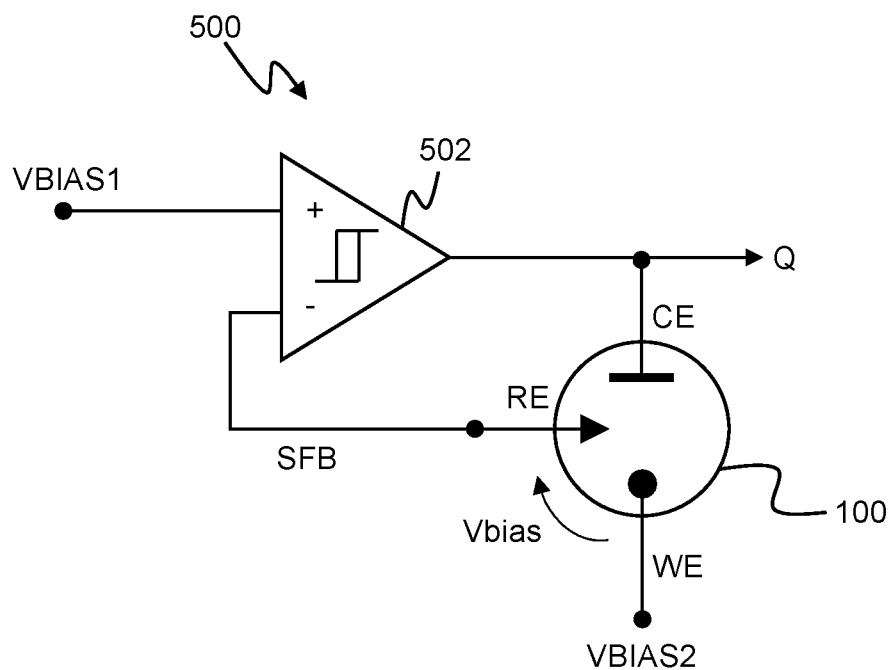
FIG. 5B is a schematic diagram of a measurement circuit for measuring characteristics of an electrochemical cell.

To switch between different measurement regimes, it may be preferable to independently control the voltages provided at the comparator 502 and the working electrode WE. FIG. 5B shows the measurement cell 500 of FIG. 5A. However, in this example, the non-inverting input of the comparator 502 is coupled to a first bias voltage VBIAS1 and the working electrode WE is set to a second voltage VBIAS2. The first and second bias voltages VBIAS1, VBIAS2 may be set to positively or negatively bias the cell 100. For example, when the first bias voltage VBIAS1 is less than the second bias voltage VBIAS2, the cell 100 may be operated as a hydrogen peroxide based sensor. For example, when the first bias voltage VBIAS1 is greater than the second bias voltage VBIAS2, the cell 100 may be operated as a oxygen based sensor.

It will be appreciated that any of the following arrangements may be modified for negative or positive biasing depending on application.

Figure 7:
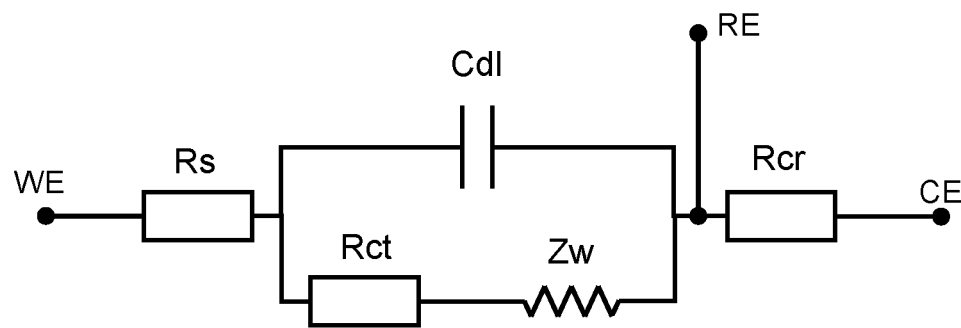
FIG. 7 is a diagram of a Randles equivalent circuit.

FIG. 7 shows an equivalent circuit 700 which may be used to approximate the impedances ZCE, ZWE, ZRE of the counter, working and reference electrodes CE, WE, RE. The circuit 700 incorporates a Randles circuit (a known equivalent circuit for modelling an electrode immersed in an electrolyte). The circuit 700 comprises an electrolyte (or ionic) resistance Rs in series with the parallel combination of a double layer capacitance Cdl and an impedance of a faradaic reaction. The impedance of the faradaic reaction comprises an active charge transfer resistance Rct in series with an electrochemical diffusional resistance, known as the Warburg impedance Zw. The Randles circuit is known in the art and so will not be described in more detail here. The combined impedance of the counter and reference electrodes CE, RE are represented by a resistance Rcr.

From this circuit, it can be seen that as the analyte concentration increases in the cell 100, the charge transfer resistance Rct decreases, leading to a change in impedance associated with the feedback path. This in turn leads to a change of the time the output signal Q stays at each output state VH, VL. As such, the output signal Q is a PWM signal which is encoded with information concerning the concentration of an analyte in the cell 100.

Using a hysteresis comparator 502 as opposed to a conventional non-hysteresis comparator results in fewer toggles or switches of the comparator 502 and therefore a reduction in power consumption. Additionally, the PWM output Q from the hysteresis comparator 502 can be easily decoded, either by considering it as a single bit output or by treating it as a PWM waveform directly. This provides a further reduction in the processing power required to characterise the cell 100.

Figure 8:
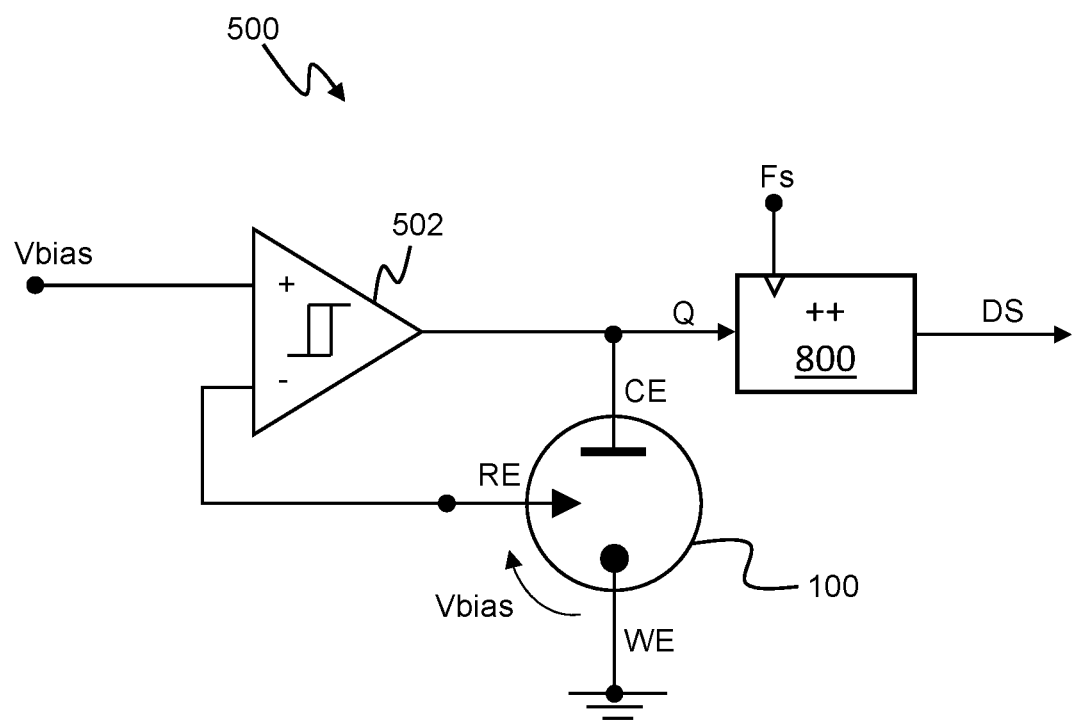
FIG. 8 is a schematic diagram of a decoder configured to decode an output of the measurement circuit shown in FIG. 5.

FIG. 8 shows an example decoder 800 for decoding the PWM signal Q output from the hysteresis comparator 502. The decoder 800 comprises a counter clocked with a clock signal Fs having a higher frequency than the frequency of the output signal Q. The output signal Q from the comparator 502 is provided as a data input to the decoder 800. The decoder 800 is configured to count the number of periods or oscillations of the clock signal Fs in a single period of the output signal Q. The decoder 800 then outputs this count as a digital count output DS. It will be appreciated that the quantisation error of the decoder 800 is determined by the time resolution of the counter, which itself depends on the frequency of the clock signal Fs. In some embodiments, the rising edge of the output signal Q may be synchronised to the clock signal Fs.

To reduce quantisation error, a voltage-controlled oscillator (VCO), not shown, may be arranged at the input of the decoder 800 and configured to output an oscillation signal where the frequency of the oscillations depends on the level of the input to the VCO. The counter would then be arranged to receive the oscillation signal from the VCO and count the number of oscillations in a frame period defined by the clock signal Fs. Over the course of several frames, the average count value will depend on the amount of time that the time-encoded signal Q spends in one state, thus controlling the VCO to output a first frequency, compared to the amount of time that the output signal Q spends in the other state, thus controlling the VCO to output a second frequency. Thus, the average count value is related to the duty cycle of the output signal Q.

The use of a VCO provides some noise shaping, as would be understood by one skilled in the art. The quantisation error at low frequencies associated with decoder 800 is reduced as any error in one frame, e.g. any difference between the clock edge defining the end of the frame and the end of the oscillation at the end of the frame, is carried forward to the next frame. The quantisation noise at higher frequencies is increased, but this may be readily removed by downstream digital filtering without affecting the audio signal frequency band. The use of a VCO thus allows accurate conversion with clock rates that are significantly lower than the clock rates required when using a counter alone.

In FIGS. 5 and 6, the hysteresis comparator 502 is asynchronous. When the output Q is decoded by a decoder such as the decoder 800 described above, quantisation error will be introduced. To ameliorate quantisation error, some embodiments of the disclosure may implement synchronous hysteretic comparison in which transitions in the time-encoded signal are synchronised to a clock signal.

Figure 9:
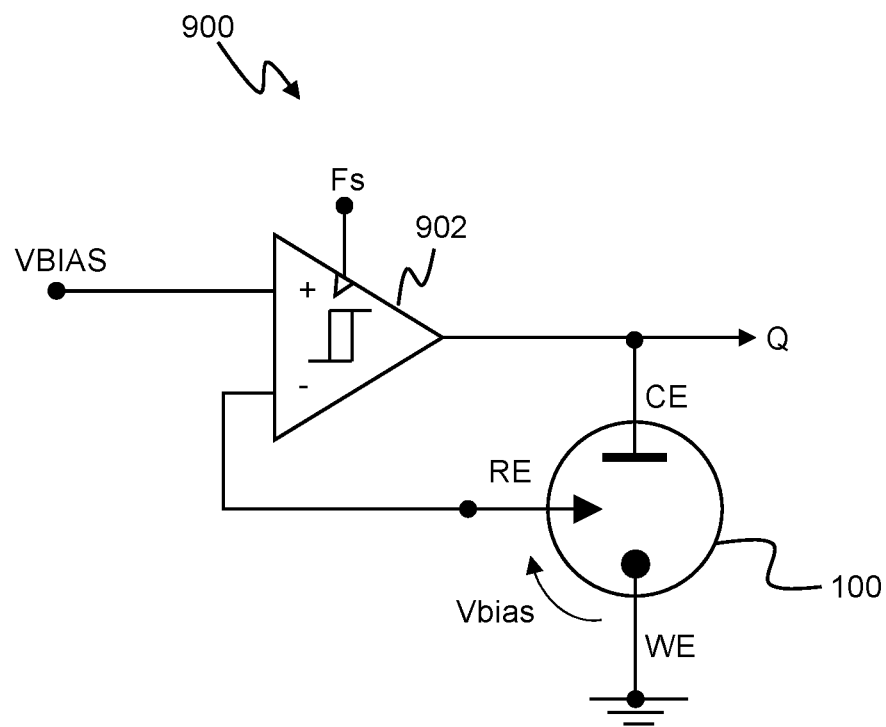
FIG. 9 is a schematic diagram of a synchronous measurement circuit for measuring characteristics of an electrochemical cell.

FIG. 9 is a schematic diagram of an example measurement circuit 900 which is similar to the measurement circuit 500 shown in FIG. 5, but comprising a synchronous (or latched) hysteresis comparator 902 in place of the (asynchronous) comparator 502. In practice, the synchronous hysteresis comparator 902 may be implemented using the combination of an asynchronous hysteresis comparator having a latch configured at its output.

The synchronous hysteresis comparator 902 is clocked with a clock signal Fs. Thus, transitions of the output signal Q are synchronised to the clock signal Fs and so the period α of a pulse of the output signal Q of one state and the period β of a pulse of the other state are synchronised to the clock signal Fs. By synchronising the transitions in the time-encoded signal to the clock signal Fs, a counter such as that shown in FIG. 8, which is clocked by the clock signal Fs (or a synchronous clock signal derived therefrom) can be used to produce count values corresponding to the duration of the time-encoded signal directly, without any quantisation error being introduced by the counter.

During operation, when the output Q of the hysteretic comparator 902 is in the high state the capacitance of the cell 100 will charge until the voltage at the second (inverting) comparator input is equal to Q+H. At this point, at the next relevant clock edge of the clock signal Fs, the output of the hysteretic comparator 902 will swap to the low state and the capacitance of the cell 100 will start discharging until the voltage drops to SIN−H. The rate of charging and discharging will depend on the voltage difference across the resistance of the cell 100. As explained above, voltage across the capacitance of the cell 100 will vary between SIN−H and SIN+H, and thus the rate of charging or discharging of capacitance of the cell thus depends on the error between the output state and the voltage VBIAS at the first (non-inverting) input of the comparator 902.

Whilst the embodiments shown in FIGS. 5, 8 and 9 are hysteretic in voltage, embodiments of the disclosure are not limited to voltage hysteresis.

Figure 10:
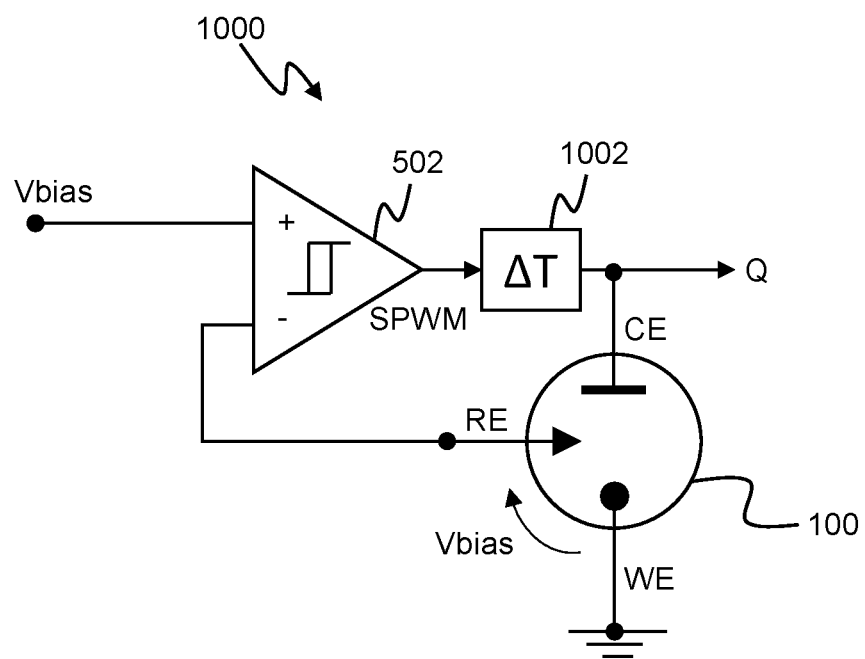
FIG. 10 is a schematic diagram of a measurement circuit for measuring characteristics of an electrochemical cell.

FIG. 10 is a schematic diagram of a measurement circuit 1000, a variation of the measurement circuit 500 shown in FIG. 4 but which is hysteretic in time. Like parts have been given like numerals. The measurement circuit 1000 further comprises a delay element 1002 configured to apply a controlled delay within the feedback loop of the comparator 502. As such, there is a delay between a change in output state of the comparator 502, i.e. a change in state of the PWM signal from the high output state VH to the low output state VL or vice-versa, and a corresponding change in state of the second input signal provided to the comparator 502, i.e. a change from ramping-up to ramping-down or vice-versa. In some embodiments the delay element 1002 may comprise a variable delay element which can be controlled to selectively vary the amount of delay applied. By controlling the delay applied by the delay element 1002, the cycle frequency of the output signal Q can be controlled. The benefits of such control will be described in more detail below.

In this embodiment, both hysteresis and a controlled delay are applied in the feedback loop. A cycle frequency of the output signal Q from comparator 502 thus depends on both the delay applied by the delay element 1002 and the amount of hysteresis applied by the comparator 502, which in turn (as explained above) depends on the impedance characteristics of the cell 100.

In this case, the output signal Q is a delayed version of the PWM signal SPWM. In other embodiment, there may also (or alternatively) be a delay element in the feedback path, for example between the reference electrode RE and the second input of the comparator 1102.

The effect of the use of delay in PWM circuits is described in detail in U.S. Pat. No. 10,348,282 B1, the contents of which is hereby incorporated by reference in its entirety.

Figure 11:
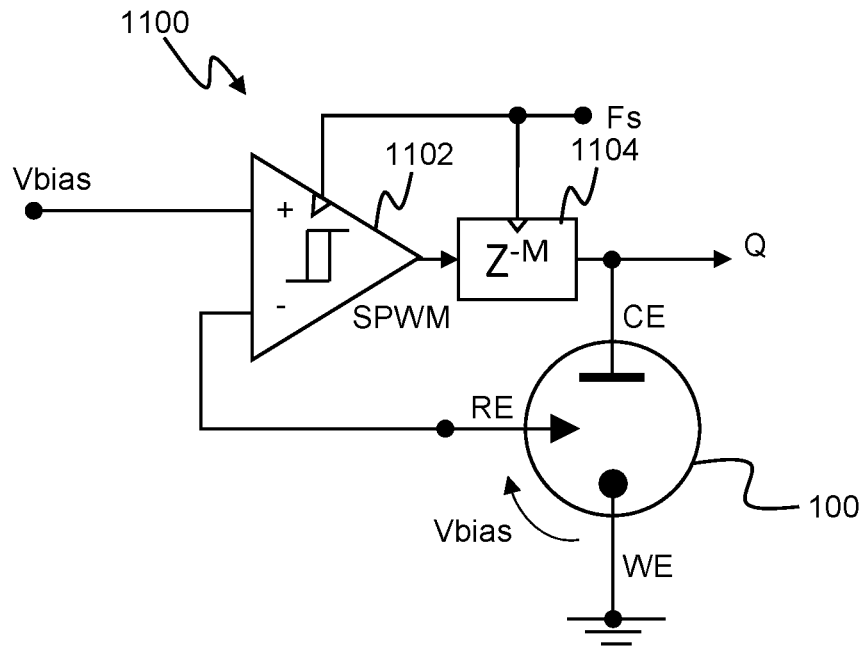
FIG. 11 is a schematic diagram of a measurement circuit for measuring characteristics of an electrochemical cell.

FIG. 11 shows a measurement circuit 1100 which is a synchronous variation of the measurement circuit 1000 shown in FIG. 10. The measurement circuit 1100 comprises a synchronous (or latched) comparator 1102 and a synchronised delay element 1104. The comparator 1102 is configured such that any signal transitions in the output from the modulator are synchronised to a clock signal Fs and the delay element 1104 comprises a digital delay element which is synchronised to the clock signal Fs.

Embodiments above are described above with reference to a three-electrode cell 100 comprising a counter electrode CE, a working electrode WE and a reference electrode RE. Embodiments of the disclosure are not, however, limited to having three-electrodes. The concepts described herein are equally applicable to two-electrode cells. In particular, in any of the embodiments described above, the three-electrode cell 100 may be replaced with a two-electrode cell.

Figure 12:
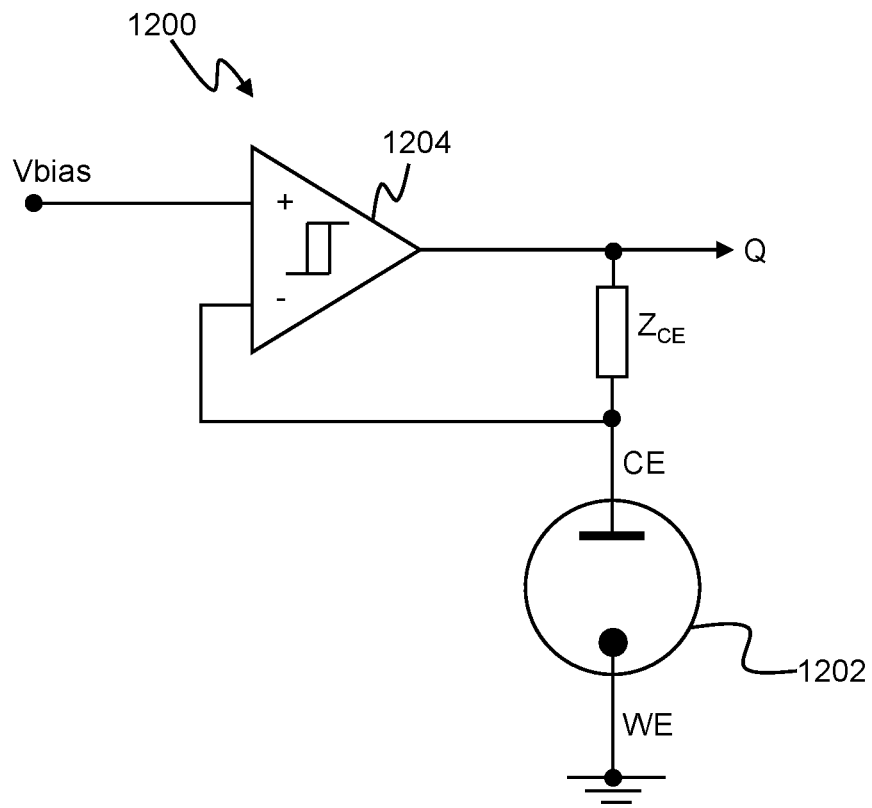
FIG. 12 is a schematic diagram of a measurement circuit for measuring characteristics of a two-electrode electrochemical cell.

FIG. 12 illustrates a measurement circuit 1200 comprising a two-electrode cell 1202, a hysteretic comparator 1204, and an impedance ZCE. Referring again to FIG. 3, the PWM circuit 300 comprises a loop filter arrangement 306 with an impedance 308 in the feedback path and the capacitance 310 coupled between the feedback path and a reference voltage. The measurement circuit 1200 also has an impedance Zce in the feedback path. However, in contrast to the PWM circuit 300, the capacitance 310 is replaced with the two-electrode cell 1202 coupled between the feedback path and the reference voltage (ground in this example). The counter electrode CE of the two-electrode cell 1202 is coupled to the feedback path and the working electrode WE of the two-electrode cell 1202 is coupled to the reference voltage.

Thus, the impedance Zce and the impedance of the cell 1202 act as a loop filter arrangement in a similar manner to the loop filter arrangement 306 of the PWM circuit 300 shown in FIG. 3. As such, variations in the impedance of the cell 1202 lead to changes in the delay applied in the feedback path between the output and second input of the hysteresis comparator 1204. It is preferable that the impedance Zce be much greater than the impedance of the cell 1202 so that the current injected at the counter electrode CE of the cell 1202 can be accurately controlled.

The impedance Zce of the measurement circuit 1200 may be implemented in several ways. Two non-limiting examples are shown in FIGS. 13 and 14.

Figure 13:
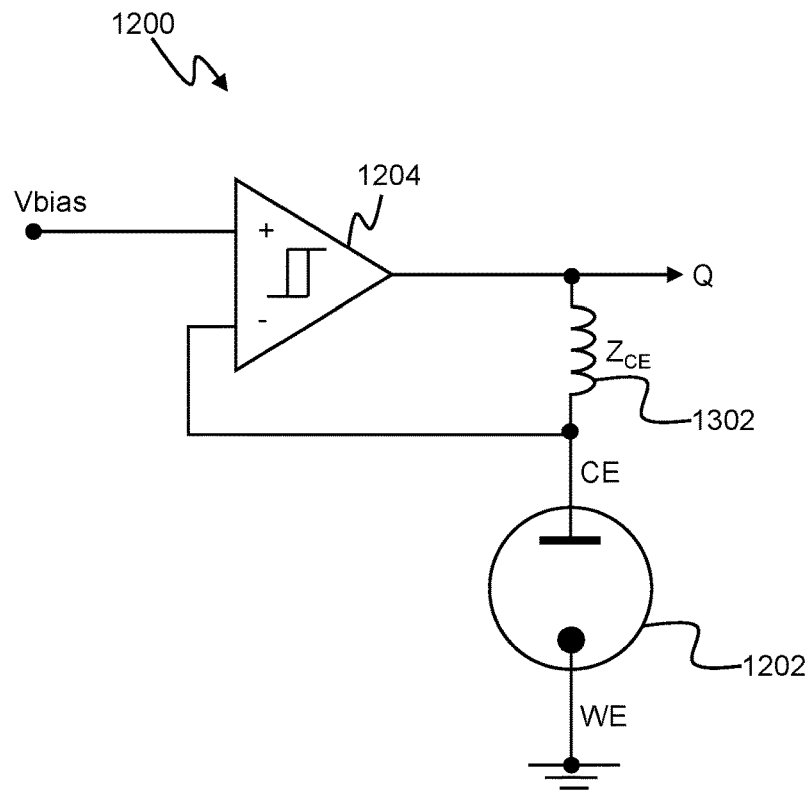
FIG. 13 is a schematic diagram of a measurement circuit for measuring characteristics of a two-electrode electrochemical cell.

FIG. 13 is a first example of the measurement circuit 1200 shown in FIG. 12. In this example the impedance Zce is provided by an inductor 1302 which provides the high output impedance Zce for the comparator 1204.

Figure 14A:
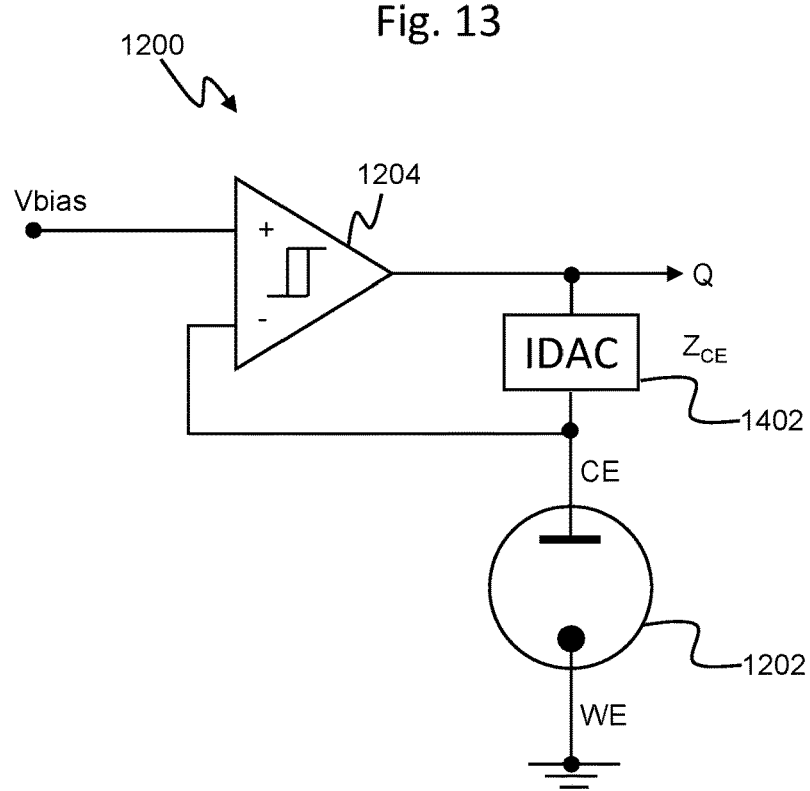
FIG. 14A is a schematic diagram of a measurement circuit for measuring characteristics of a two-electrode electrochemical cell comprising a current digital-to-analog converter (IDAC)

FIG. 14A is a second example of the measurement circuit 1200 in which the impedance Zce is provided by a current digital-to-analog converter (IDAC) 1402. The output of the comparator 1204 is coupled to an input of the IDAC 1402. An output of the IDAC 1402 is couple to the counter electrode CE of the cell 1202 and also to the second input of the comparator 1204. Thus, the IDAC 1402 is configured to inject a current at the counter electrode CE which is dependent on the respective durations α1 and β1 of the output signal Q output from the comparator 1204.

Figure 14B:
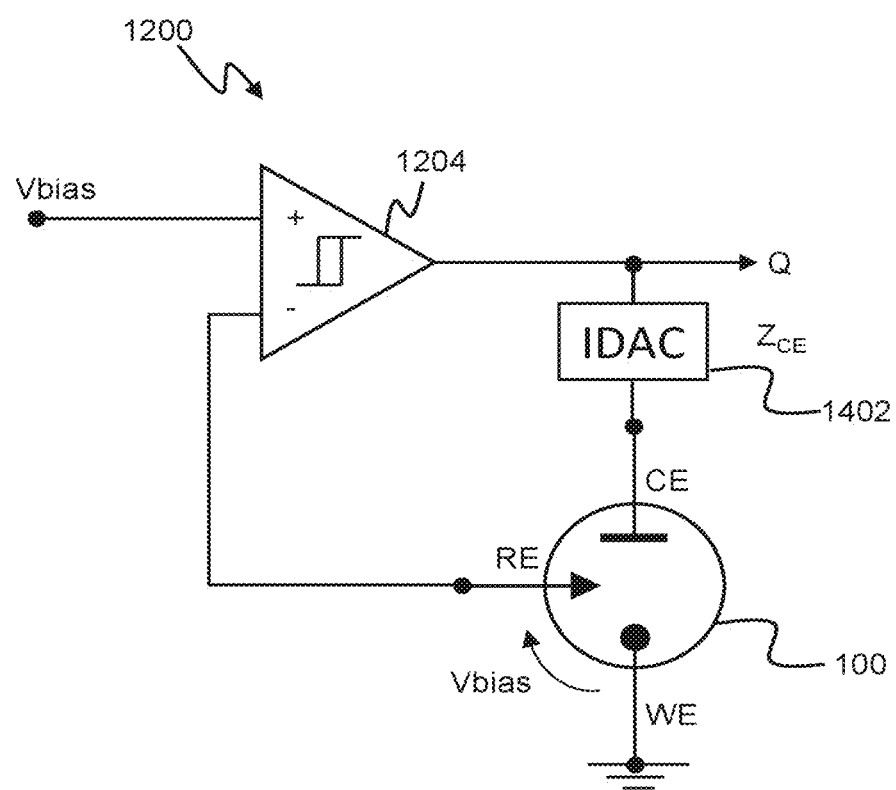
FIG. 14B is a schematic diagram of a measurement circuit for measuring characteristics of a three-electrode electrochemical cell comprising a current digital-to-analog converter (IDAC)

FIG. 14B shows a three-electrode cell variation of the measurement circuit 1200 shown in FIG. 14A. In place of the two-electrode cell 1202, the three-electrode cell 100 is provided. In this example, the output of the IDAC 1402 is not coupled to the second input of the comparator 1204. Instead, the output of the IDAC 1402 is coupled to the counter electrode CE of the cell 100 and the reference electrode RE of the cell 100 is coupled to the second input of the comparator 1204.

It will be appreciated that an IDAC or equivalent current source may be provided at the input of the counter electrode CE in any of the arrangements discussed above. For example, in FIG. 10, an IDAC (or other current source) may optionally be provided between the counter electrode CE and the output of the delay element 1002. For example, in FIG. 11, an IDAC (or other current source) may optionally be provided between the counter electrode CE and the output of the delay element 1104. Providing a controlled current source at the counter electrode CE of the various cells 100, 1202 has the advantage of enabling the measurement circuit 1200 to exhibit a linear response as a function of the impedance and/or the current associated with the cell 100.

Figure 15:
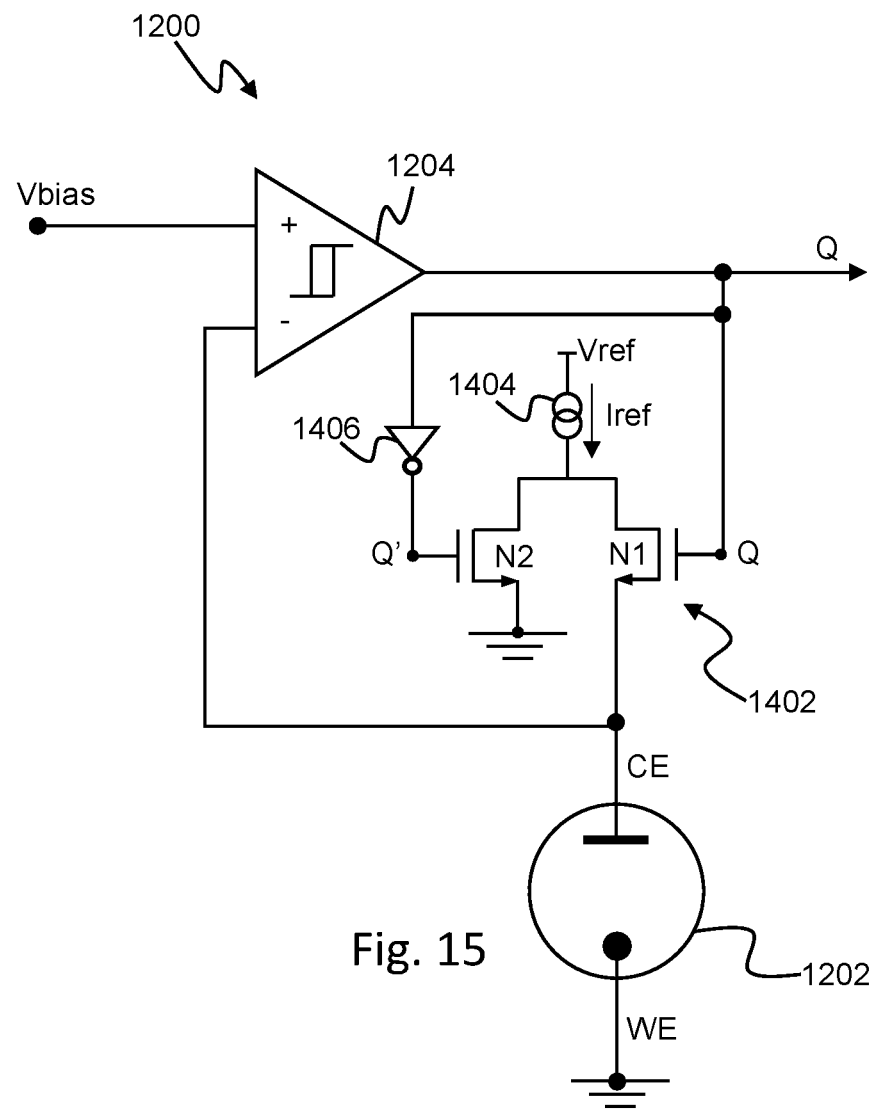
FIG. 15 is schematic diagram of the measurement circuit of FIG. 14 showing the IDAC in more detail.

FIG. 15 shows an example implementation of the IDAC 1402, specifically with respect to the two-electrode cell arrangement shown in FIG. 14A (although such an implementation could equally be implemented in the three-electrode arrangement shown in FIG. 14B). The IDAC 1402 comprises a pair of transistors N1, N2 having their respective drains coupled to a current source 1404. The source of the first transistor N1 is coupled to a ground reference voltage. The source of the second transistor N2 is coupled to the counter electrode CE. The gates of the first and second transistors N1, N2 are provided with the output signal Q and the compliment Q' of the output signal Q, respectively. An inverter 1406 is provided to generate the complement Q' if the output signal Q. Thus, the output of the current source 1404 is switched between the counter electrode CE (via the first transistor N1) and the ground reference (via the second transistor N2). The duration spent in each state is dependent on the respective durations a1 and 31 of the output signal Q. In the embodiment shown in FIG. 15, the first and second transistors N1, N2 are PMOS devices. In the embodiments NMOS devices may be used (or any other suitable switching devices known in the art). In the embodiment shown in FIG. 15, the IDAC 1402 switches the counter electrode CE between Iref and ground. In other embodiments, a bipolar implementation of the IDAC 1402 may be used, for example to switch the counter electrode between Iref and −Iref.

Embodiments of the disclosure described herein aim to reduce the overall power and size of the drive and measurement circuitry required to measure analyte concentration in electrochemical sensors. It will therefore be appreciated that it is advantageous to be able to disconnect or powered down one or more elements of the measurement circuits 500, 900, 1000, 1100, 1200 described above, whilst not substantially affecting the performance of the electrochemical cell 100.

In a variation of the embodiment shown in FIG. 14 as well as all other embodiments including an IDAC, the IDAC 1402 may be replaced with a finite impulse response DAC (FIR DAC).

Accordingly, in some embodiments, hold circuitry may be introduced to enable each of the measurement circuits 500, 900, 1000, 1100, 1200 to be switched into a hold mode. The hold mode may act to pause measurement, such that one or more components may be powered down. To do so, the hold circuitry preferably holds the counter electrode at a predetermined voltage.

Figure 16:
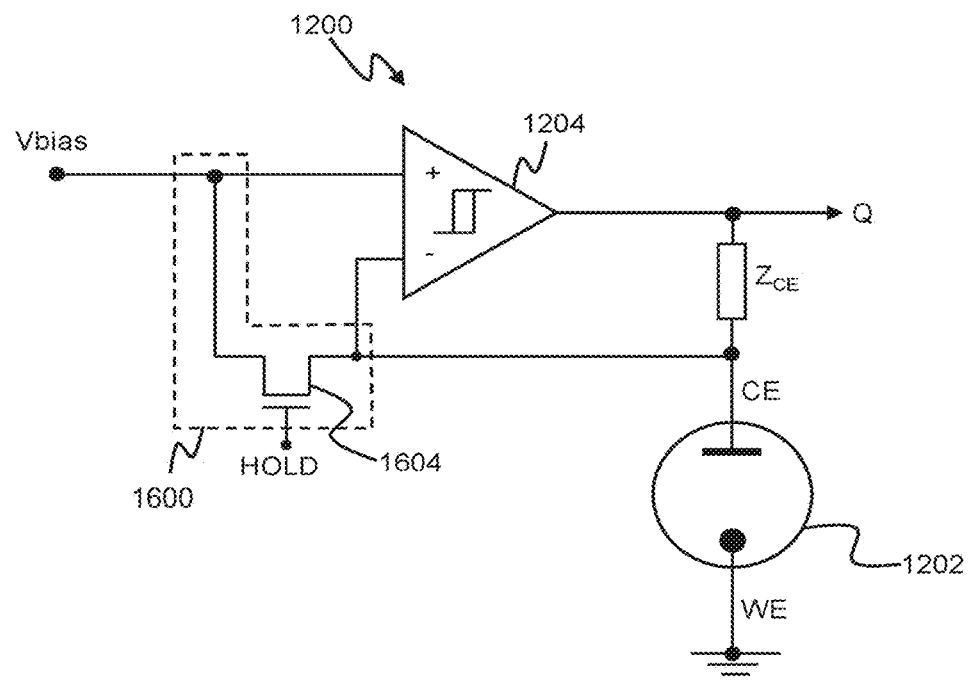
FIG. 16 is a schematic diagram of a measurement circuit for measuring characteristics of a two-electrode electrochemical cell comprising a hold circuit.

FIG. 16 illustrates an example hold circuit 1600 implemented in the measurement circuit 1200 of FIGS. 12 to 15. The hold circuit 1600 comprises a switch 1604 (in this instance a transistor) coupled between the inverting input of the comparator 1204 and the non-inverting input of the comparator 1204. The switch 1604 is controlled by a hold signal HOLD. The measurement circuit 1200 may be moved into the hold state by closing the switch 1604 (using the hold signal HOLD) to hold the counter electrode CE at the predetermined voltage, in this case Vbias. The comparator 1204 may then be powered down between measurements to minimise power consumption between measurement events. For measurement, comparator 1204 may be powered up and the switch 1604 opened to resume measurement.

In the embodiments described above, a single order loop filter is provided in each of the measurement circuits 500, 900, 1000, 1100, 1200. In some applications, it may be advantageous to increase the order of the loop filter used for hysteresis.

Figure 17:
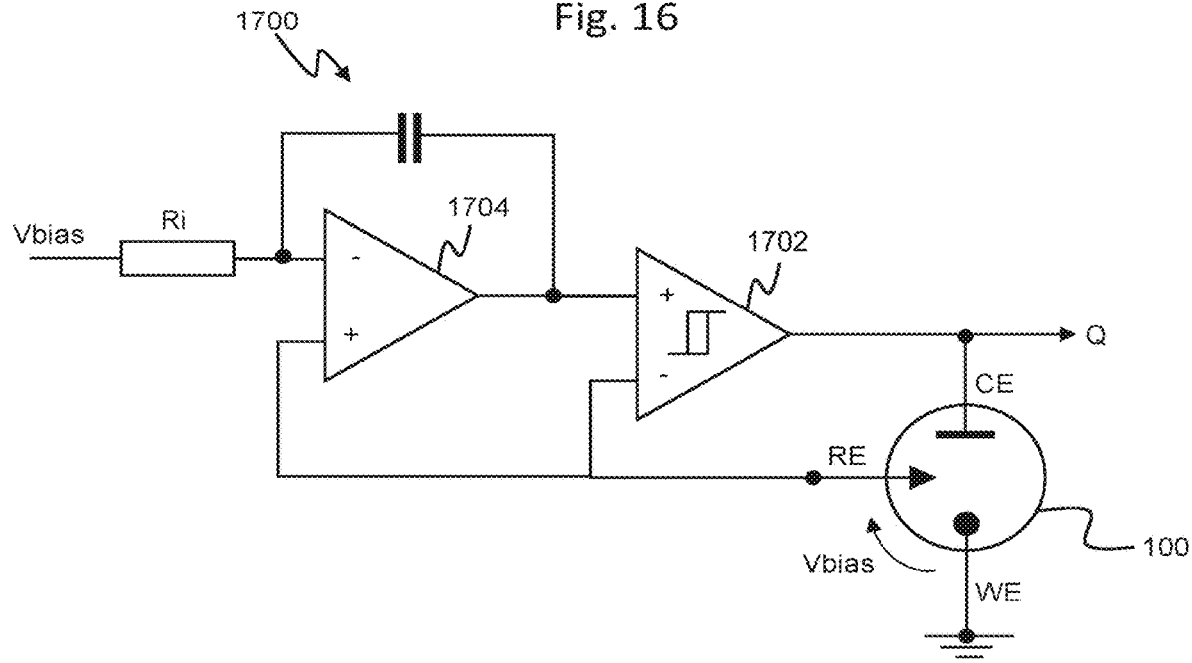
FIG. 17 is a schematic diagram of a measurement circuit for measuring characteristics of a two-electrode electrochemical cell with a second order feedback loop.

FIG. 17 illustrates one such example measurement circuit 1700 which comprises a hysteretic comparator 1702, the measurement cell 100 and an op-amp based integrator 1704. In this example the output signal Q serves a feedback signal which is filtered by the measurement cell 100 and the integrator 1704. The integrator 1704 is provided between the input bias voltage VBIAS and a first (non-inverting) input of the comparator 1702. The bias voltage VBIAS is provided to a first (inverting) input of the integrator 1704. The second (non-inverting) input of the integrator is coupled to the reference electrode. As such, the integrator 1704 is configured to integrate the input voltage VBIAS in the forward path. It will be appreciated that FIG. 15 provides just one of several example topologies for implementing multi-order filtering in the feedback loop.

As mentioned previously, by reducing the size and power of drive and measurement circuitry, multiple electrochemical sensors can be integrated into a single device, thereby either providing redundancy or enabling the sensing of multiple analytes in a single chip. This may be particularly advantageous in applications such as continuous glucose monitoring, where it may be desirable to measure concentrations of several analytes including but not limited to two or more of glucose, ketones, oxygen, lactate, and the like.

Figure 18:
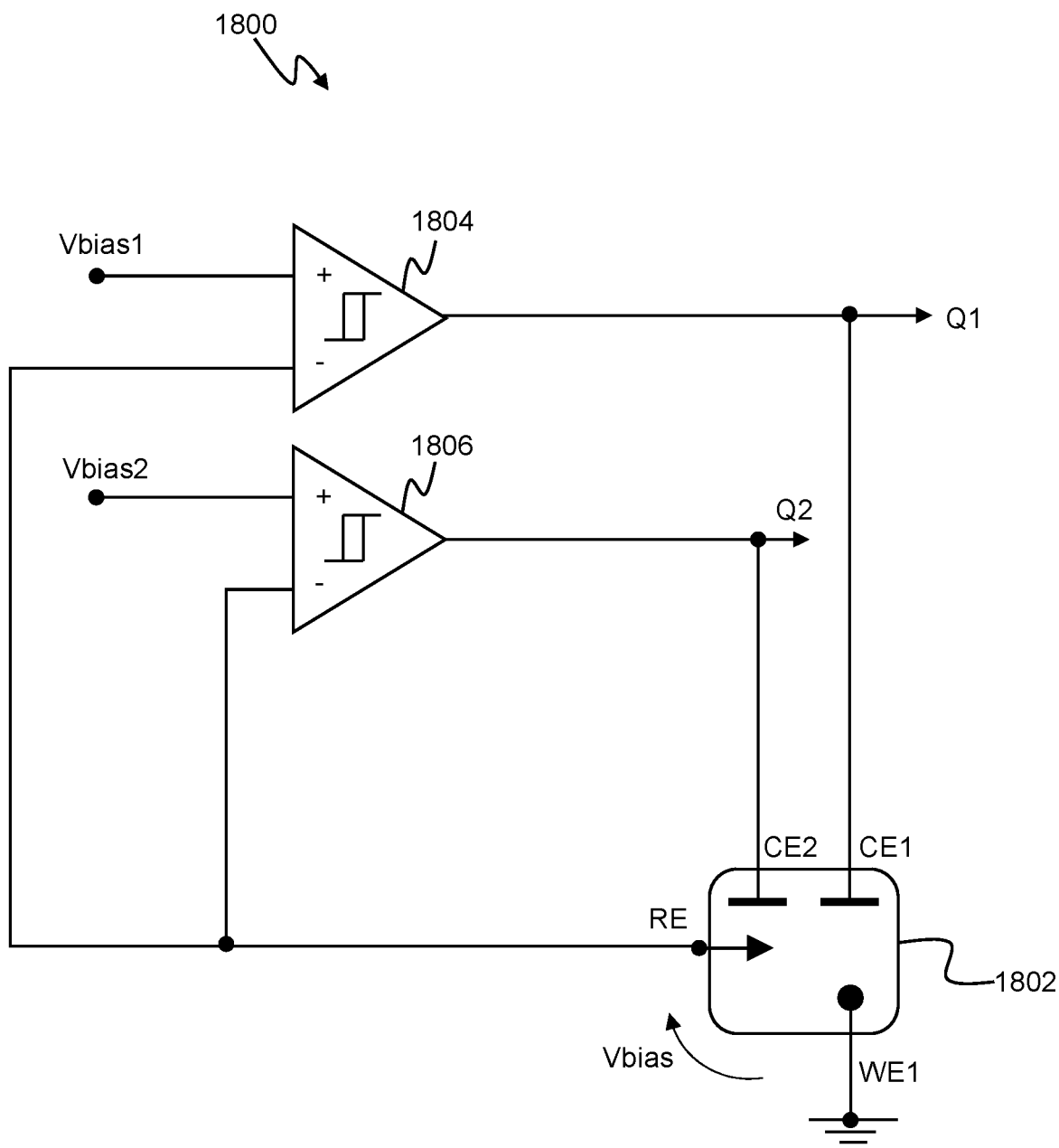
FIG. 18 is a schematic diagram of a multi-analyte measurement circuit for measuring characteristics of multiple analytes in an electrochemical cell.

FIG. 18 illustrates multi-analyte measurement circuit 1800 configured to measure two analytes. The measurement circuit 1800 comprises a measurement cell 1802 comprising first and second counter electrodes CE1, CE2, a common working electrode WE and a common reference electrode RE. The measurement circuit 1800 further comprises a first hysteretic comparator 1804 and a second hysteretic comparator 1806. Each of the first and second hysteretic comparators 1804, 1806 are configured in a similar manner to the comparator 502 of FIG. 5.

A first input of the first hysteretic comparator 1804 is coupled to a first bias voltage VBIAS1. An output of the first hysteretic comparator 1804 is coupled to the first counter electrode CE1 and the reference electrode RE is coupled to a second input of first hysteretic comparator 1804. As such, a feedback loop between the output of the first hysteretic comparator 1804 and the second input via the first counter electrode CE1. Thus, the first hysteretic comparator 1804 is configured to output a first output signal Q1 which is a PWM signal representing a first analyte concentration associated with current flow between the first counter electrode CE1 and the working electrode WE.

A first input of the second hysteretic comparator 1806 is coupled to a second bias voltage VBIAS2. The second bias voltage VBIAS2 may be different or the same as the first bias voltage VBIAS1. An output of the second hysteretic comparator 1806 is coupled to the second counter electrode CE2 and the reference electrode RE is coupled to a second input of second hysteretic comparator 1806. As such, a feedback loop is formed between the output of the second hysteretic comparator 1806 and the second input via the second counter electrode CE2. Thus, the second hysteretic comparator 1806 is configured to output a second output signal Q1 which is a PWM signal representing a second analyte concentration associated with current flow between the second counter electrode CE2 and the working electrode WE. The working electrode WE is coupled to a reference voltage (in this case ground GND).

Thus, the measurement circuit 1800 is able to measure two different analyte concentrations using a common measurement cell 1802 and only two hysteretic comparators 1804, 1806. Whilst the measurement circuit 1800 shown in FIG. 2 is configured to characterise two different analytes, in other embodiments, any number of analytes may be measured by providing an additional counter electrode and hysteretic comparator for each additional analyte to be characterised. It will also be appreciated that the hysteretic comparators 1804, 1806 shown in FIG. 18 may be replaced with any one of the arrangements described above with reference to FIGS. 5 to 17 without departing from the scope of the present disclosure.

Figure 19:
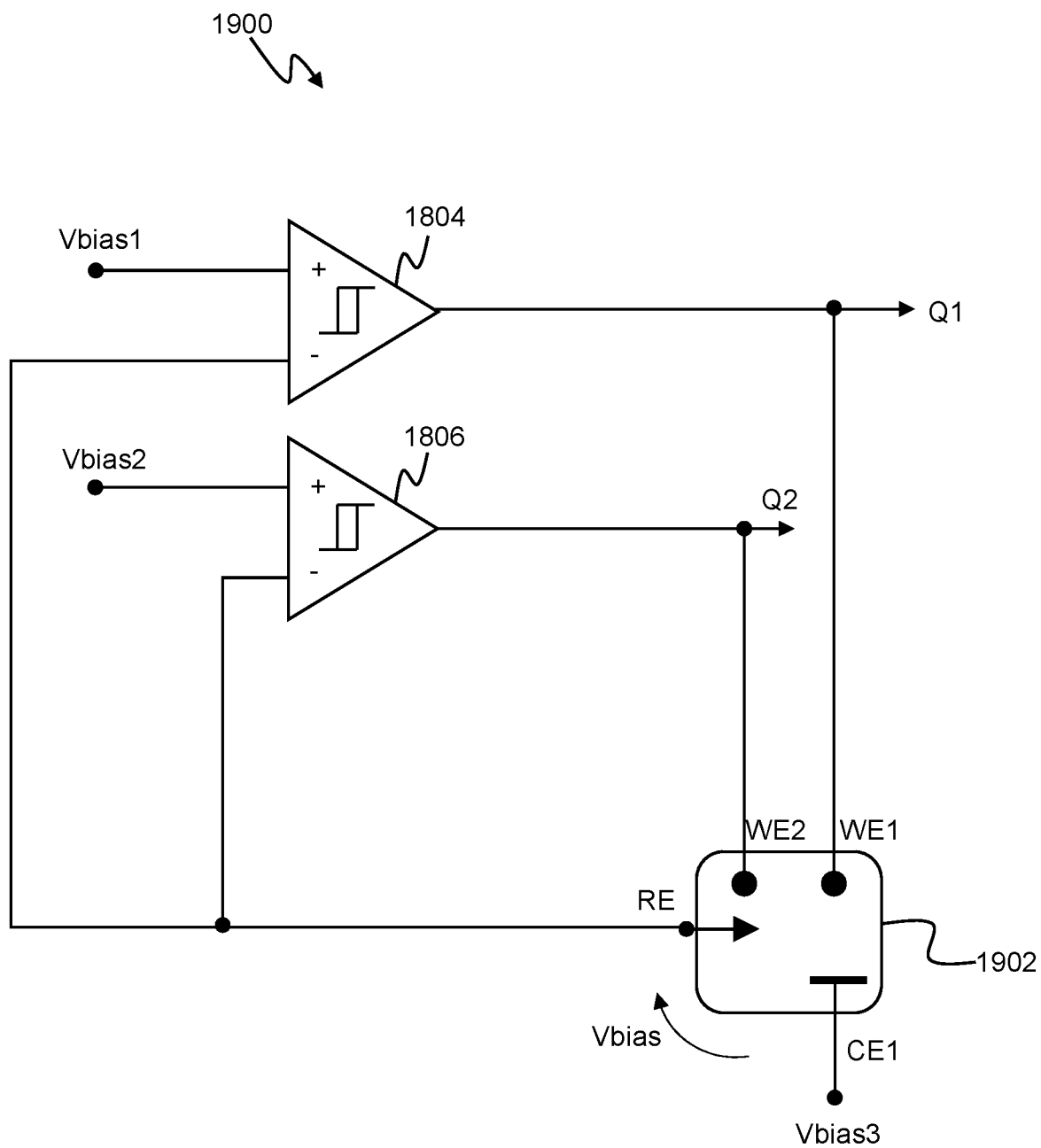
FIG. 19 is a schematic diagram of a multi-analyte measurement circuit for measuring characteristics of multiple analytes in an electrochemical cell.

FIG. 19 illustrates multi-analyte measurement circuit 1900, which is a variation of the multi-analyte measurement circuit 1800 shown in FIG. 18, configured to measure two analytes. Like part have been given like numerals. The measurement circuit 1900 comprises a measurement cell 1902 comprising first and second working electrodes WE1, WE2, a common counter electrode CE and a common reference electrode RE. The measurement circuit 1900 further comprises the first hysteretic comparator 1804 and the second hysteretic comparator 1806. Each of the first and second hysteretic comparators 1804, 1806 are configured in a similar manner to the comparator 502 of FIG. 5.

A first input of the first hysteretic comparator 1804 is coupled to a first bias voltage VBIAS1. An output of the first hysteretic comparator 1804 is coupled to the first working electrode WE1 and the reference electrode RE is coupled to a second input of first hysteretic comparator 1804. As such, a feedback loop is formed between the output of the first hysteretic comparator 1804 and the second input via the first working electrode WE1. Thus, the first hysteretic comparator 1804 is configured to output a first output signal Q1 which is a PWM signal representing a first analyte concentration associated with current flow between the first working electrode WE1 and the counter electrode CE.

A first input of the second hysteretic comparator 1806 is coupled to a second bias voltage VBIAS2. The second bias voltage VBIAS2 may be different or the same as the first bias voltage VBIAS1. An output of the second hysteretic comparator 1806 is coupled to the second working electrode WE2 and the reference electrode RE is coupled to a second input of second hysteretic comparator 1806. As such, a feedback loop between the output of the second hysteretic comparator 1806 and the second input via the second working electrode WE2. Thus, the second hysteretic comparator 1806 is configured to output a second output signal Q2 which is a PWM signal representing a second analyte concentration associated with current flow between the second working electrode WE2 and the counter electrode CE.

It can be seen from FIG. 19 that the counter electrode CE is coupled to a third bias voltage VBIAS3 which is different to the first bias voltage VBIAS1 and the second bias voltage VBIAS2. The third bias voltage VBIAS3 may, for example, be greater than the first and second bias voltages VBIAS1, VBIAS2. Alternatively, the third bias voltage VBIAS3 may, for example, be less than the first and second bias voltages VBIAS1, VBIAS2, for example ground GND.

Thus, like the measurement circuit 1800, the measurement circuit 1900 is able to measure two different analyte concentrations using a common measurement cell 1902 and two hysteretic comparators 1804, 1806. Whilst the measurement circuit 1900 shown in FIG. 2 is configured to characterise two different analytes, in other embodiments, any number of analytes may be measured by providing an additional working electrode and hysteretic comparator for each additional analyte to be characterised. It will also be appreciated that the hysteretic comparators 1804, 1806 shown in FIG. 19 may be replaced with any one of the arrangements described above with reference to FIGS. 5 to 17 without departing from the scope of the present disclosure.

As noted above with respect to FIGS. 14A, 14B and 15, in some embodiments a feedback DAC may be provided in the feedback path between the output of the respective comparators and an input of such comparators. Further implementations of such arrangements will now be described.

Figure 20:
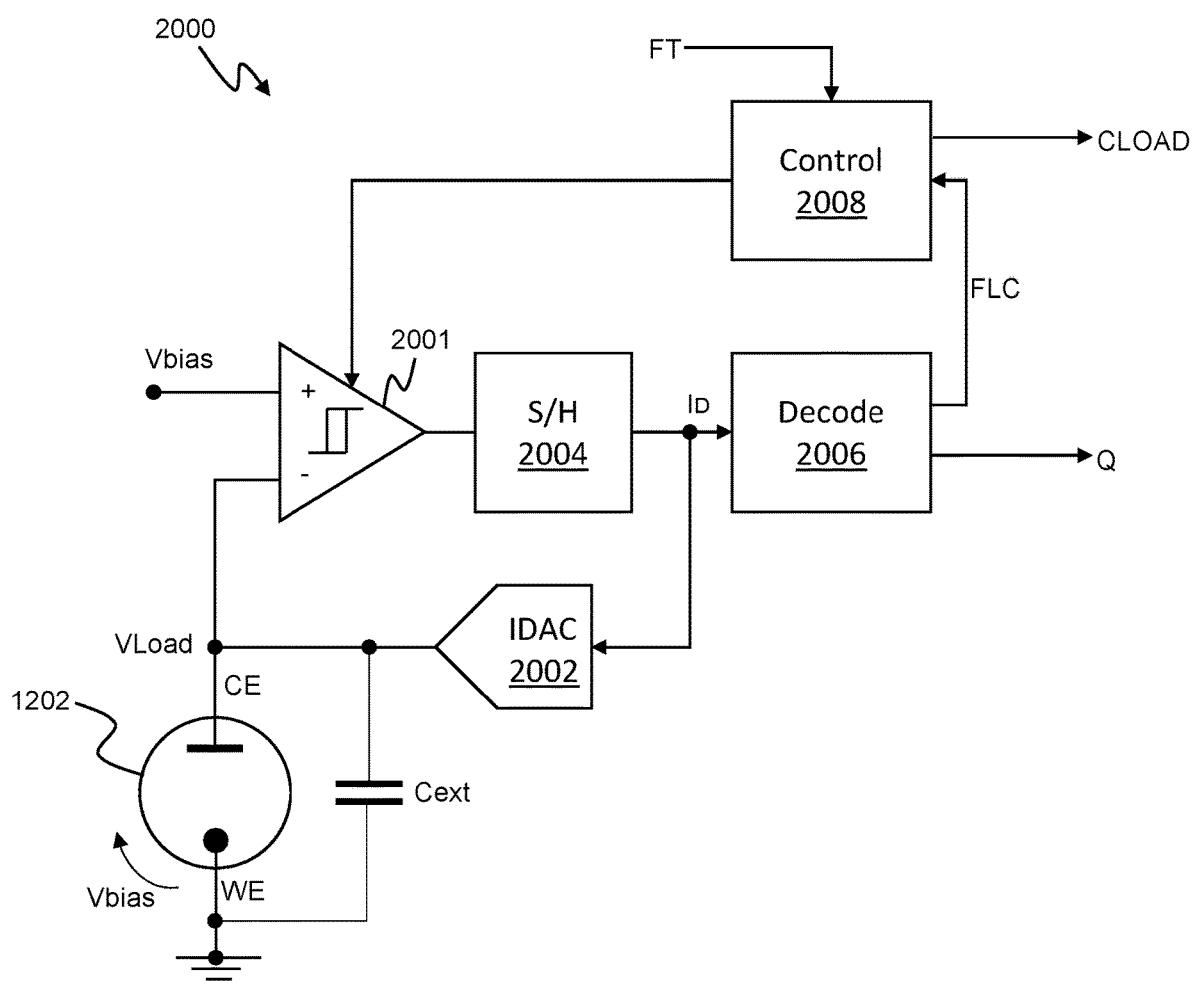
FIG. 20 is a schematic diagram of a measurement circuit for measuring characteristics of a two-electrode electrochemical cell.

FIG. 20 schematically illustrates an example measurement circuit 2000 which is a variation of the measurement circuit 1200 described above. Like parts have been given like numbering. The measurement circuit 2000 comprises the measurement cell 1202 and a hysteretic comparator 2001. The measurement circuit 2000 additionally comprises an IDAC 2002, a sample and hold circuit 2004, a decoder 2006, and a control module 2008. In other embodiments, the IDAC 2002 may be replaced with a FIR DAC.

A first (e.g., non-inverting) input of the comparator 2001 is coupled to a bias voltage VBIAS. A second (e.g., inverting) input of the comparator 2001 is coupled to an output of the IDAC 2002 and the counter electrode CE of the cell 1202. The working electrode WE of the cell 1202 is coupled to a reference voltage (in this case ground GND). An output of the comparator 2001 is coupled to an input of the sample and hold circuit 2004 which samples the PWM output and provides the sampled value to the IDAC 2002 and the decoder 2006.

The sample and hold circuit 2004 acts to synchronise the forward path so as to enable successful decoding by the decoder 2006. In an alternative embodiment, the comparator 2001 and the sample and hold circuit 2004 may be replaced with a synchronous (e.g., latched or clocked) comparator, such as the comparator 902 shown in FIG. 9.

An output of the decoder 2006 is provided to the control module 2008. Optionally, an external capacitor CEXT may be coupled between the counter electrode CE and the working electrode WE. The external capacitor CEXT may be provided, for example, where the intrinsic capacitance of the cell 1202 is low. To maximise linearity of the measurement circuit 2000, the limit cycle frequency FLC is preferably on a transition band in the loop filter (in the feedback path). Such a transition band may be a frequency band at which the impedance of the loop filter is reducing with frequency, as opposed to a frequency band at which the impedance is constant with respect to frequency. In a practical implementation, the measurement cell 1202 (or cell 100) may have a complicated impedance, exhibiting a region of constant impedance at a frequency at which it may be desirable to set the limit cycle frequency FLC of the measurement circuit 2000 (e.g. to minimize power consumption). Adding the external capacitor CEXT with a sufficient large capacitance can aid in ensuring that the impedance of the loop filter reduces with increasing frequency, thereby providing more freedom to set the limit cycle frequency FLC At a desirable level.

It will be appreciated that power minimization requirements may call for a very large capacitance. However, an increase in capacitance of the external capacitor CEXT may lead to an increase in circuit area, power consumption and noise. To ameliorate this issue, in some embodiments, the external capacitor CEXT may be implemented as a capacitor multiplier or other active capacitive arrangement. Capacitor multipliers are known in the art and so will not be described in more detail here.

During operation, the IDAC 2002 generates a current in dependence on the PWM signal ID output from the sample and hold circuit 2004. The generated current flows through the measurement cell 1202 such that a voltage across the cell 1202 is equal to the bias voltage VBIAS. At the same time, the decoder decodes (e.g., decimates) the PWM signal ID and outputs a decoded data signal Q which is proportional to the current flowing through the cell 1202.

As explained above, due to hysteresis in the comparator 2001, the output ID from the sample and hold circuit 2004 is a PWM signal transitioning between a high output state (e.g., VH) and a low output state (e.g., VL) at a limit cycle frequency FLC (or cycle frequency or carrier frequency). With reference to FIG. 4 above, the limit cycle frequency FLC is the inverse of the cycle period T. It will be appreciated, particularly in the embodiment shown in FIG. 20, that it would be advantageous for the limit cycle frequency FLC of the signal output from the comparator 2001 to be controlled within a predetermined frequency range. For example, the sample and hold circuit 2004 is configured to sample the PWM signal output from the comparator 2001 at a sampling rate R. Having a limit cycle frequency FLC much greater than the sampling rate R may lead to loss of information and/or aliasing of the PWM signal output from the IDAC.

As such, the limit cycle frequency FLC (or cycle period) of the PWM signal ID output from the sample and hold circuit 2004 are determined by the decoder 2006, which outputs determined limit cycle frequency FLC to the control module 2008.

The control module 2008 may then be configured to control hysteresis in the comparator 2001 based on the limit cycle frequency FLC of the PWM signal ID to stabilize limit cycle frequency FLC within a predetermined range. Such a predetermined range may, for example, be dependent on the sampling rate R of the sample and hold circuit 2004. The control module 2008 may, for example, adapt hysteresis of the comparator 2001 based on a comparison between the limit cycle frequency FLC and a target frequency FT. The target frequency FT may be set to a frequency which trades off power consumption and linearity. The lower the limit cycle frequency FLC, the less linear the circuit 2000. Conversely, the higher the limit cycle frequency FLC, the higher/better the linearity, at a cost of additional switching, and therefore increased power consumption.

Figure 21:
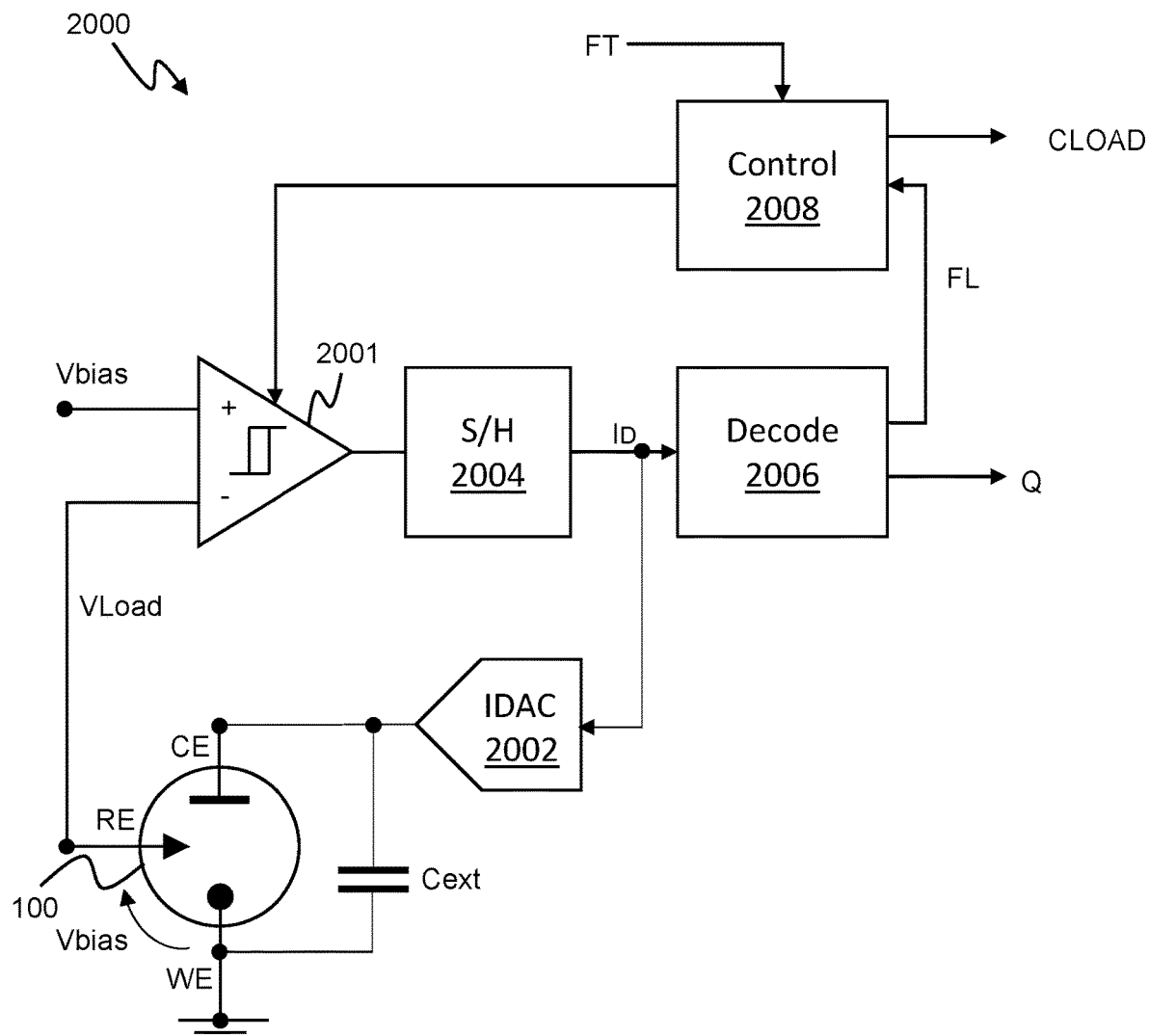
FIG. 21 is a schematic diagram of a measurement circuit for measuring characteristics of a three-electrode electrochemical cell.

FIG. 21 shows a measurement circuit 2100 which is a variation of the measurement circuit 2000 of FIG. 20, in which the two-electrode cell 1202 has been replaced with the three-electrode cell 100. Like parts are denoted with like numberings. In contrast to the measurement circuit 2000, instead of the second input of the comparator 2001 being coupled to the output of the IDAC 2002, the second input of the comparator 2001 is coupled to reference electrode RE of the two-electrode cell 100.

In addition to controlling hysteresis of the comparator 2001, the control module 2008 may be configured to determine, from the limit cycle frequency/period FLC/TLC, one or more characteristics of the cell 1202, as is explained in more detail below.

It will be appreciated that either of the measurement cells 100, 1202 can be modelled either as a current load or a resistive load. For example, when the measurement cell 1202 is biased with a constant bias voltage, the measurement cell 1202 may be best modelled as a current load. In contrast, when the measurement cell 1202 is biased with a varying bias voltage, the measurement cell 1202 may be best modelled as a resistive load.

Figure 22:
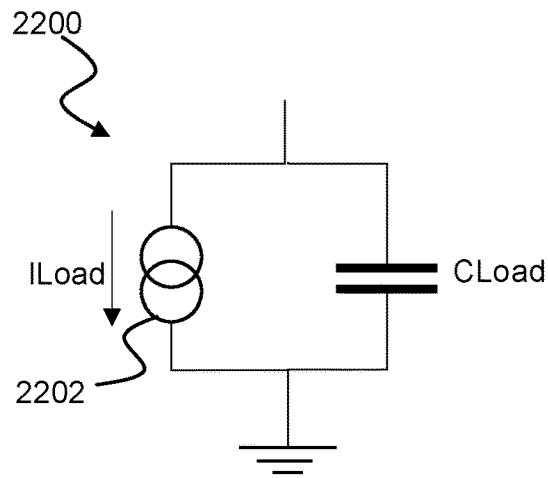
FIG. 22 is an example circuit model for an electrochemical cell.
Figure 23:
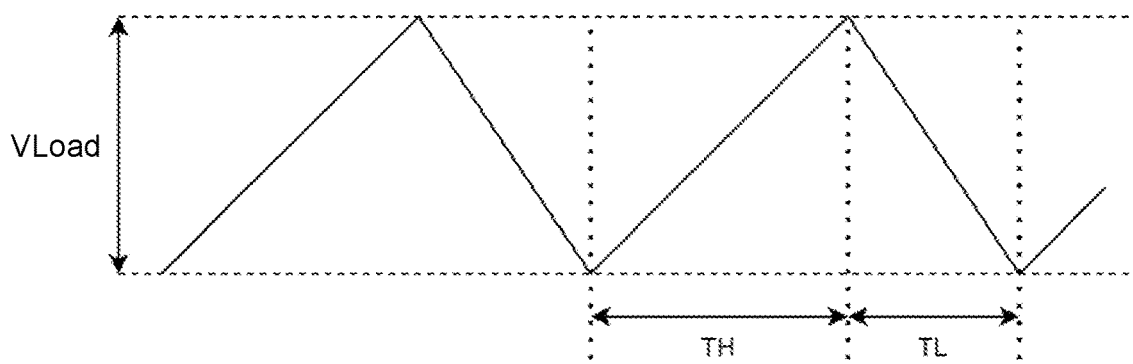
FIG. 23 is a diagram of a load voltage waveform for the electrochemical cell of FIG. 20 or 21 based on the circuit model of FIG. 22.

Thus, in some embodiments, the measurement cell 1202 may be modelled, as shown in FIG. 22, as a current load 2200 comprising a current source 2202 producing a current ILoad in parallel with a load capacitor CLoad, as shown in FIG. 22. FIG. 23 is a graph illustrating an example waveform for the load voltage VLoad at the inverting input of the comparator 2001. The load voltage Vload rises during a time TH and falls during a time TL. For the current load 2200, the duration of rise and fall times TH and TL may be defined as follows.

$$T_H = \frac{V_{Load}C_{Load}}{I_{DAC} - I_{Load}}$$

$$T_L = \frac{V_{Load}C_{Load}}{I_{DAC} + I_{Load}}$$

As such, the decoded current Q output from the decoder 2006 may be defined as follows, where IDAC is the current provided to the IDAC 2002 and the decoder 2006.

$$Q = \frac{T_H - T_L}{T_H + T_L} = \frac{I_{Load}}{I_{DAC}}$$

The PWM cycle period TLC of the output signal ID may be defined as follows:

$$T_{LC} = T_H + T_L = \frac{2I_{DAC}V_{hys}C_{Load}}{(I_{DAC} + I_{Load})(I_{DAC} - I_{Load})}$$

Assuming voltage domain hysteresis in the comparator 2001 VHYS is the voltage required to switch the comparator 2001 (i.e. the hysteresis of the comparator). Thus, since the load current ILOAD is known from the decoded output Q, the estimated capacitance CLOAD of the cell 1202 can be determined from the limit cycle period TLC (or frequency FLC) using the above equation.

Thus, the control module 2008 may be configured to output the value of capacitance CLOAD based on the limit cycle frequency FLC or limit cycle period TLC.

Figure 24:
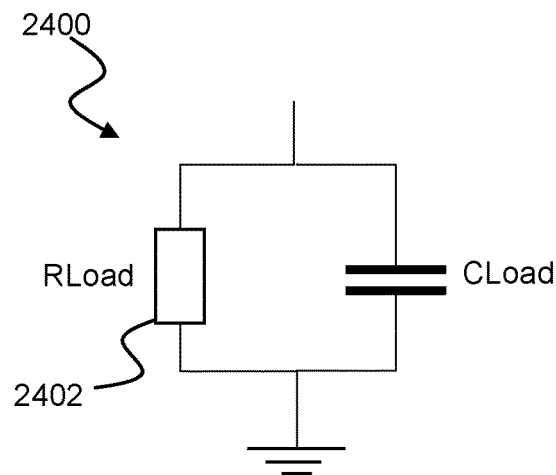
FIG. 24 is an example circuit model for an electrochemical cell.

As mentioned above, in some embodiments, the cell 1202 (or the cell 100) may be modelled as a resistive load 2400, as shown in FIG. 24, comprising a resistor 2402 having a resistance RLOAD in parallel with a load capacitor CLoad, as shown in FIG. 22.

For the resistive load 2400, the duration of rise and fall times TH and TL may be defined as follows.

$$T_H = -R_{Load}C_{Load}\log\left(\frac{V_{bias} + V_{hys} - R_{Load}I_{DAC}}{V_{bias} - V_{hys} - R_{Load}I_{DAC}}\right)$$

-continued $$T_L = -R_{Load}C_{Load}\log\left(\frac{V_{bias} - V_{hys} + R_{Load}I_{DAC}}{V_{bias} + V_{hys} + R_{Load}I_{DAC}}\right)$$

The decoded output signal Q may then be defined as:

$$Q = \frac{T_H - T_L}{T_H + T_L} \approx \frac{V_{bias}}{R_{Load}I_{DAC}}$$

From the above equation, since Q, VBIAS and IDAC are known, the resistance RLOAD of the cell 1202 (or cell 100) can be determined.

Additionally, the limit cycle period TLC of the comparator 2001 may be defined as:

$$T_{limitCycle} = T_H + T_L = -R_{Load}C_{Load}\log\left(\frac{V_{bias} + V_{hys} - R_{Load}I_{DAC}}{V_{bias} - V_{hys} - R_{Load}I_{DAC}}\right) -$$

$$R_{Load}C_{Load}\log\left(\frac{V_{bias} - V_{hys} + R_{Load}I_{DAC}}{V_{bias} + V_{hys} + I_{DAC}}\right)$$

Since RLOAD is known from the decoded output Q, CLOAD can be derived from the limit cycle frequency FLC (or period TLC) determined by the decoder 2006.

As such, the modelled resistance RLOAD and capacitance CLOAD of the cell 1202 (or cell 100) can be ascertained and the cell 1202 thereby characterised.

It will be appreciated that in practical implementations of any of the measurement circuits described above, inherent flicker noise and DC offset will be present. Embodiments of the present disclosure may also implement chopping (or other auto-zero techniques) to reduce or substantially eliminate sensitivity to DC offset.

Referring to FIG. 5 as an example, the polarity of the comparator 502 may be inverted on every other cycle so as to convert any DC offset associated with the loop filter (e.g. the cell 100) into a variable DC output voltage (e.g. a square wave at a chopping frequency). This square wave present in the output signal Q can easily be filtered out by downstream filters (not shown) resulting in a filtered output signal which is free from the effects of DC offset. Preferably, chopping is synchronised with the limit cycle of the comparator 502. For example, the polarity of the comparator 502 may be inverted during a falling edge of the output Q or during a rising edge of the output Q. It will be appreciated that the falling edge of the output signal Q is the edge which varies in time to adjust the limit cycle of the comparator 502 whereas the rising edge is substantially periodic (i.e. the frequency of the rising edge is constant). As such, advantageously, chopping is synchronised with the falling edge of the output signal Q such that the chopping frequency is spread over a range of frequencies (coinciding with the falling edge of the output Q). It will be appreciated that this technique may be implemented with respect to any of the measurement circuits described in the present disclosure.

Figure 25:
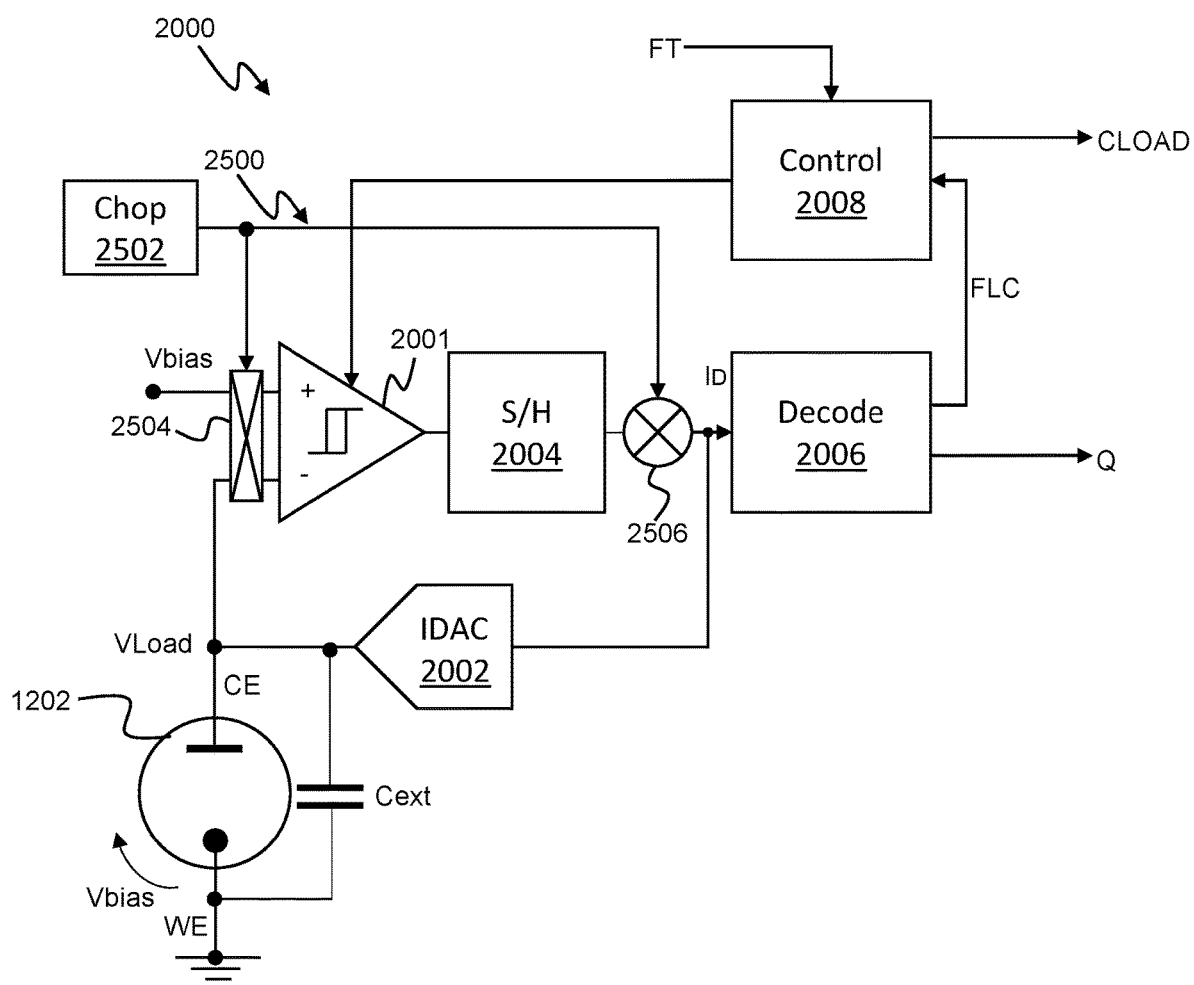
FIG. 25 is a schematic diagram of the measurement circuit of FIG. 20 with the addition of chopping circuitry.

FIG. 25 illustrates an example chopping circuitry 2500 with respect to the measurement circuit 2000 of FIG. 20. The chopping circuitry 2500 acts to account for DC offset and flicker noise in the feedforward path of the measurement circuit 2000. The chopping circuitry 2500 comprises a chopping control module 2502, a chopping module 2504 and summing module 2506. The chopping module 2504 is coupled at the inputs of the comparator 2001. The summing module 2506 may be provided at the output of the sample and hold circuit 2004 as shown in FIG. 25, or alternatively at the output of the comparator 2001 between the comparator 2001 and the sample and hold circuit 2004.

The chopping module 2504 and the summing module 2506 may controlled by the chopping control module 2502 to implement chopper stabilisation as is known in the art. The chopping circuitry 2500 may operate in a similar manner to that described above with reference to FIG. 5. For example, by switching the polarity of the circuit 2000 at a chopping frequency significantly higher than the signal bandwidth, the DC offset associated with the comparator 2001 becomes a square wave at the chopping frequency, which can easily be filtered out by the decoder 2006. To correct the polarity of the circuit 2000, an inverse switching may be implemented at the summing module (at the same chopping frequency). As such, DC measurement error caused by the comparator 2001 may be reduced or substantially eliminated.

It will be appreciated that bias voltage VBIAS applied to the first input of the comparator 2001 may also be subject to flicker noise and DC offset/drift. Such an effect may be reduced by biasing the IDAC 2002 at the same voltage as the bias voltage VBIAS. By biasing the IDAC with the bias voltage VBIAS, the decoded output signal Q may be defined as follows:

$$Q = \frac{V_{bias}}{R_{Load}I_{DAC}} = \frac{V_{bias}}{R_{Load}}\frac{R_{DAC}}{V_{bias}} = \frac{R_{DAC}}{R_{Load}}$$

As such, the decoded output Q is not dependent on the bias voltage VBIAS, such that variations in bias voltage VBIAS due to DC drift or flicker noise do not affect the decoded output Q.

Figure 26:
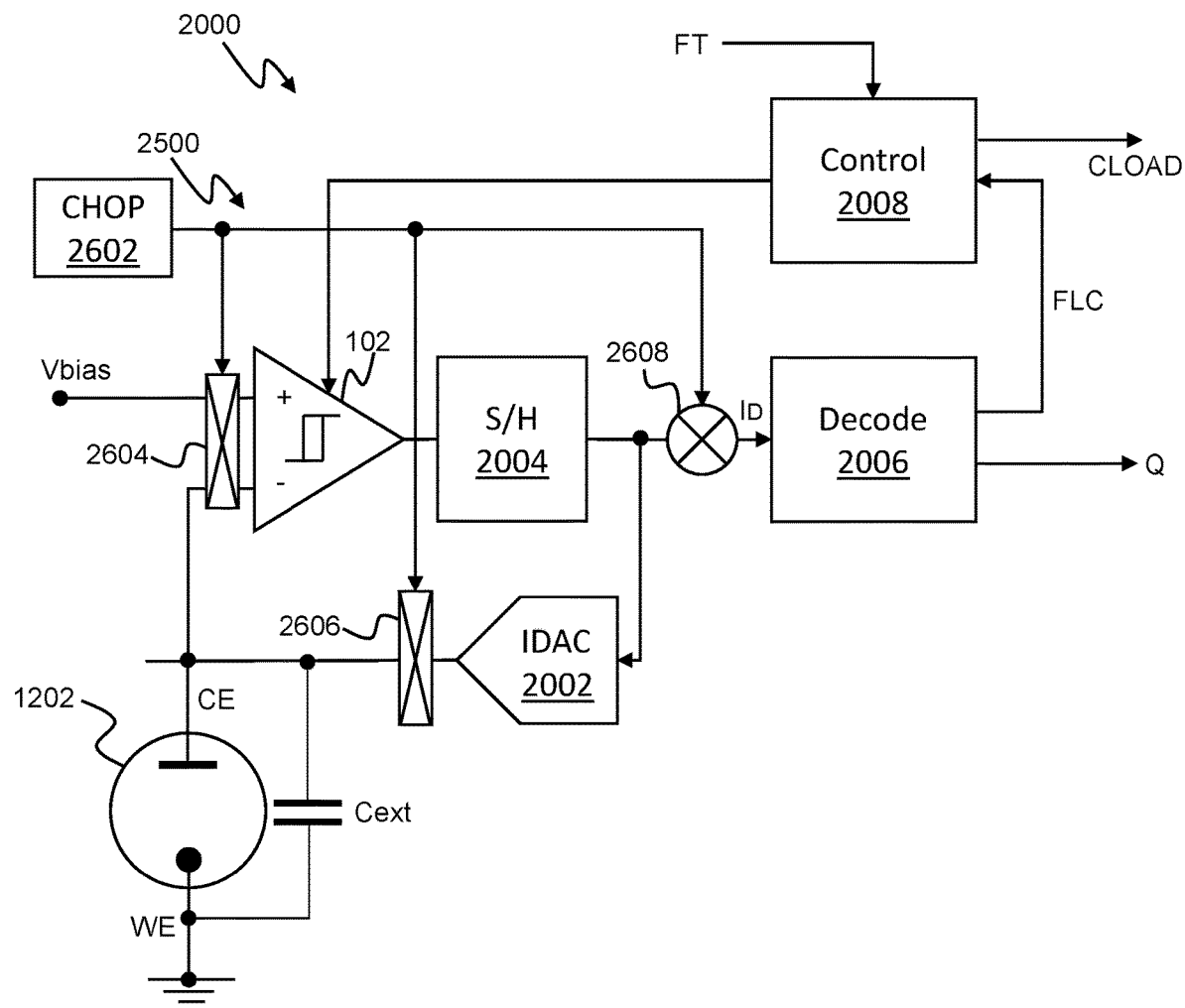
FIG. 26 is a schematic diagram of the measurement circuit of FIG. 20 with the addition of chopping circuitry.

FIG. 26 illustrates an example chopping circuitry 2600 with respect to the measurement circuit 2000 of FIG. 20. The chopping circuitry 2600 acts to account for DC offset and flicker noise in both the feedforward path and the feedback path of the measurement circuit 2000. The chopping circuitry 2600 comprises a chopping control module 2602, a first chopping module 2604, a second chopping module 2606, and a summing module 2608. The first chopping module 2604 is coupled at the inputs of the comparator 2001. The second chopping module 2606 is coupled at the output of the IDAC 2002, between the IDAC 2002 and the counter electrode CE of the cell 1202. Again, the summing module 2608 is to be provided at the input to the decoder 2006.

The first chopping module 2604, the second chopping module 2606 and the summing module 2608 may be controlled by the chopping control module 2602 to implement chopper stabilisation as is known in the art. The provision of the second chopping module 2606 in the feedback path reduces the effect of flicker noise and/or DC offset due to non-linearities associated with the IDAC 2002.

As mentioned with reference to FIGS. 18 and 19, in some embodiments, electrochemical cells comprising multiple working electrodes or multiple counter electrodes may be used.

Figure 27:
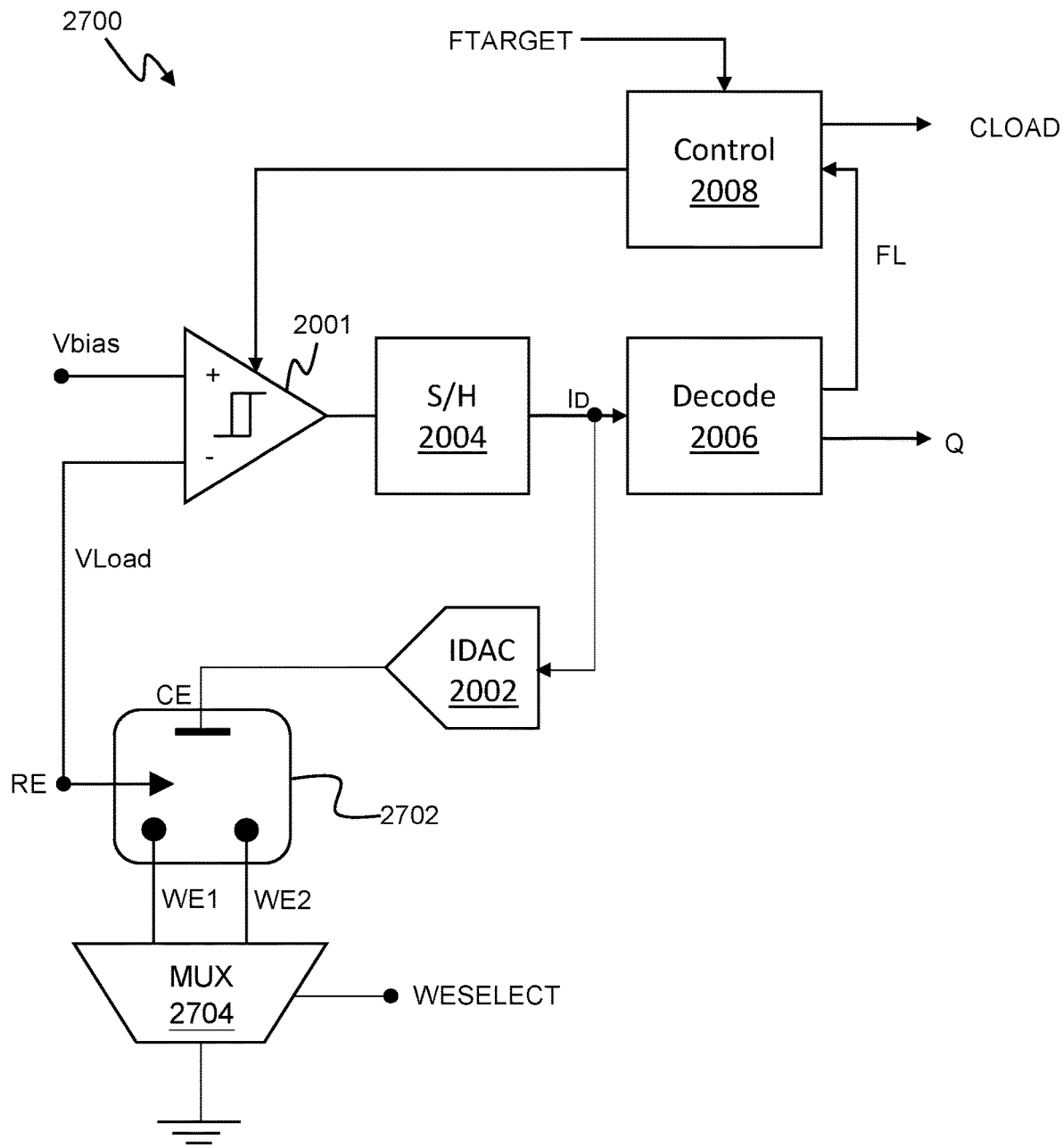
FIG. 27 is a variation of the measurement circuit of FIG. 21 with a multi-analyte electrode.

FIG. 27 illustrates multi-analyte measurement circuit 2700 configured to measure two analytes. The multi-analyte measurement circuit 2700 is substantially identical to the measurement circuit 2000 shown in FIG. 21, apart from that the three-electrode cell 100 has been replaced with a measurement cell 2702 comprising first and second working electrodes WE1, WE2, a common counter electrode CE and a common reference electrode RE. The counter electrode CE is coupled to an output of the IDAC 2002. The measurement circuit 2700 further comprises a multiplexer 2704 having inputs coupled to the first and second working electrode WE1, WE2, an output the multiplexer 2704 coupled to a reference voltage, in this case ground GND. The multiplexer 2704 is configured to selectively couple either the first working electrode WE1 or the second electrode WE2 to the reference voltage based on a working electrode select signal WESELECT received at the multiplexer 2704. The WE select signal WESELECT may be provided by the control module 2008 or another module or circuit (not shown). During operation, the measurement circuit 2700 may select to measurement a characteristic of the cell 2702 using the first working electrode WE1 by controlling the multiplexer 2704 to couple the first working electrode WE1 to the reference voltage. Equally, the measurement circuit 2700 may select to measure a characteristic of the cell 2702 using the second working electrode WE2 by controlling the multiplexer 2704 to couple the second working electrode WE2 to the reference voltage.

Figure 28:
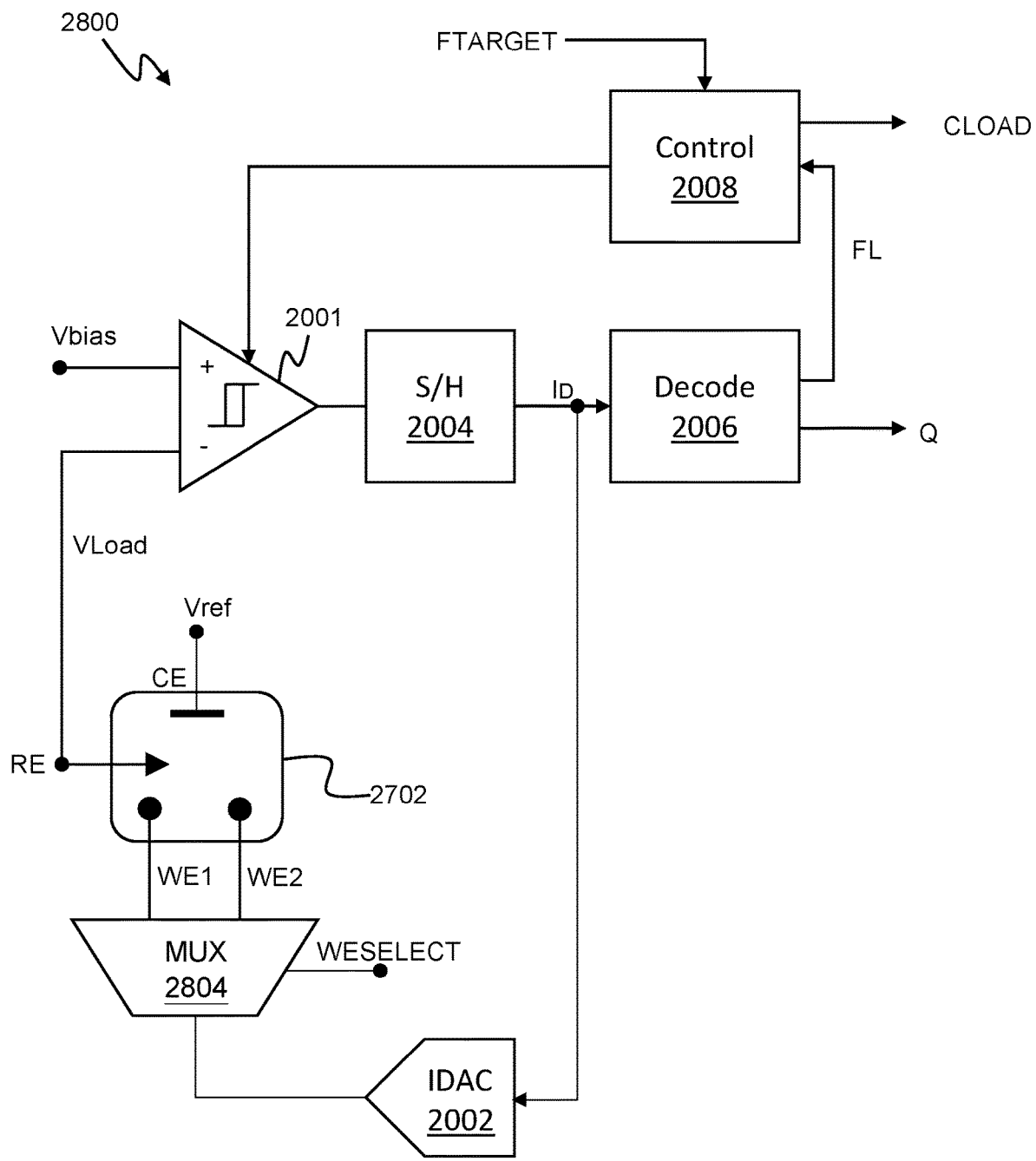
FIG. 28 is a further variation of the measurement circuit of FIG. 21 with a multi-analyte electrode.

FIG. 28 illustrates multi-analyte measurement circuit 2800 which is a variation of the measurement circuit 2700 shown in FIG. 27. The measurement circuit 2800 differs from that in FIG. 27 in the configuration of the cell 2702, the multiplexer 2704 and the IDAC 2002. The multiplexer 2704 is replaced with a multiplexer 2804 configured to multiplex a pair of outputs to an input. The counter electrode CE is coupled to a reference voltage Vref (e.g., a supply voltage VDD). The working electrodes WE1, WE2 are each coupled to a respective output of the multiplexer 2804. A sole input of the multiplexer 2804 is coupled to the output of the IDAC 2002. The multiplexer is configured to couple the input of the multiplexer 2804 (i.e., output of the IDAC 2002) to one of the outputs of the multiplexer 2804 (i.e., the first or second working electrode WE1, WE2) based on a working electrode select signal WESELECT. Like the multiplexer 2704 of FIG. 27, the WE select signal WESELECT may be provided by the control module 2008 or another module or circuit (not shown). During operation, the measurement circuit 2800 may select to measure a characteristic of the cell 2702 using the first working electrode WE1 by controlling the multiplexer 2804 to couple the first working electrode WE1 to the reference voltage. Equally, the measurement circuit 2800 may select to measure a characteristic of the cell 2802 using the second working electrode WE2 by controlling the multiplexer 2804 to couple the second working electrode WE2 to the reference voltage.

The comparators described in the above embodiments are generally operated in a hysteretic mode. Operating comparators in this mode enables substantial power savings since their outputs can easily be decoded using low-power signal processing techniques for measuring the duty cycle of the output waveform. However, this comes at a cost of adding noise in the form of a PWM tone. In some situations, it may be advantageous to suppress PWM tone so as to improve the accuracy and/or quality of measurements of characteristics of an electrochemical cell. To do so, in some embodiments, the comparators described herein may be switchable from a (low-power) hysteretic mode to a (higher power) Sigma-Delta mode where the comparator does not implement hysteresis. In doing so, the decode becomes more time and/or processor intensive since the output is equivalent to a one-bit sequence running at the frequency at which the comparator is latched. However, any PWM tone will be suppressed thereby improving the performance of any measurement circuit in which the switchable comparator is implemented.

In the embodiments described above, a DC current is applied at the counter electrode CE of the various measurement cells illustrated. In some instances, however, it may be advantageous to apply an alternating current (AC) to the counter electrode CE of any of the measurement cells in order to illuminate or excite a measurement cell at a given frequency. Referring for simplicity to FIG. 5, one way to apply AC to the counter electrode CE in the measurement cell 100 is to vary the limit cycle of the hysteretic comparator 502. This may be achieved by controlling the amount of hysteresis applied by the hysteretic comparator 502.

As noted previously, the output Q of the hysteretic comparator 502 will change state when the feedback signal SFB reaches the relevant threshold, e.g. exceeding +H or dropping below −H and will remain in that state until the other threshold is reached. The time that the signal remains in one state, i.e. duration $\alpha$ or B, will thus depend on how long it takes for feedback signal to change by the amount 2H. This will depend on the bias signal VBIAS and hence the difference between the input signal SIN and the feedback signal SFB but will also clearly depend on the threshold values and the amount of hysteresis applied.

In some embodiments, the amount of hysteresis applied by the comparator 502 may be controlled. There are many ways the hysteresis applied by a hysteretic comparator may be varied as will be understood by one skilled in the art.

The hysteresis applied by the comparator 502 may be controlled so as to control the cycle period (and cycle frequency). To do so, the output cycle period of the output signal Q may be monitored and used to adjust the hysteresis applied. For example, the count value $\alpha+\beta$ which is produced or derived from a decoder (such as the decoder 800 of FIG. 8) could be used to determine the current cycle period (or frequency) of the output signal Q.

The limit cycle period/frequency may thus be controlled so as to apply a time-varying current to the counter electrode CE at a predetermined frequency. The limit cycle may be varied either by adjusting the bias voltage VBIAS, or if a delay element is provided in the feedback path (such as the delay element 1002 shown in FIG. 10), by varying the delay of the delay element.

Controlling of the hysteresis applied also allows the cycle period of the output signal Q to be controlled to remain substantially constant on a cycle-by-cycle basis. Additionally, or alternatively, the hysteresis control could be used to enable operation in different modes, for instance to provide a trade-off between performance and power consumption. For example the limit cycle frequency of the time-encoded signal could be reduced to save power under certain conditions, for example when fewer samples of analyte concentration are required. When it is determined that more samples are required over a shorter period, the limit cycle could be increased. Adaptive hysteretic control is described in more detail in U.S. Pat. No. 10,256,837, the contents of which is incorporated by reference in its entirety.

In some embodiments, characteristics of the loop filter (e.g. the electrochemical cell 100) may be inferred from known variable(s) and measured parameter(s). Referring as an example to FIG. 5, the hysteresis applied by the comparator 502 may be known and the limit cycle of output signal Q may be measured. Since the impedance of the loop filter comprising the cell 100 is proportional to the hysteresis and the limit cycle, the overall impedance of the system may be determined. If the loop filter comprises N circuit elements (for example), then by measuring the limit cycle at each of N different values of hysteresis (implemented by the comparator), then N equations may be derived and solved to fully define the parameters of each of the N elements of the loop filter. In some embodiments, the relationship between the hysteresis and limit cycles may be defined in a lookup table which may in turn be used to determine one or more characteristics of the cell 100. It will be appreciated that this technique may be implemented with respect to any of the measurement circuits described in the present disclosure.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Circuitry for measuring a characteristic of an electrochemical cell, the circuitry comprising:
a hysteretic comparator having a first comparator input, a second comparator input and a comparator output;
a feedback path between the comparator output and the second comparator input configured to provide a feedback signal to the second comparator input;
a loop filter configured to apply filtering to the feedback path to generate the feedback signal, wherein the loop filter comprises the electrochemical cell; and
control circuitry configured to adapt a hysteresis of the comparator based on a limit cycle frequency or limit cycle period of a comparator output signal derived from the comparator output.

2. Circuitry of claim 1, wherein the hysteretic comparator is hysteretic in voltage or hysteretic in time.

3. Circuitry of claim 1, wherein the electrochemical cell comprises at least one working electrode, a counter electrode and a reference electrode, and wherein the comparator output is coupled to the counter electrode and the reference electrode is coupled to the second comparator input.

4. Circuitry of claim 3, further comprising an external capacitor coupled between the counter electrode and the working electrode.

5. Circuitry of claim 3, wherein the at least one working electrode is coupled to a variable reference voltage.

6. Circuitry of claim 3, further comprising:
one or more additional counter electrodes; and
a multiplexer configured to switchably couple a reference voltage between the counter electrode and the one or more additional counter electrodes.

7. Circuitry of claim 3, further comprising:
one or more additional working electrodes; and
a multiplexer configured to switchably couple a reference voltage between the working electrode and the one or more additional working electrodes.

8. Circuitry of claim 7, further comprising:
an additional hysteretic comparator for each of the one or more additional working electrodes, each additional hysteretic comparator comprising an additional first comparator input, an additional second comparator input and an additional comparator output; and
an additional feedback path between each additional comparator output and each additional second comparator input configured to provide an additional feedback signal to a respective additional second comparator input, wherein each additional comparator output is coupled to a respective additional working electrode.

9. Circuitry of claim 1, wherein the electrochemical cell comprises at least one working electrode and a counter electrode, wherein the comparator output is coupled to the counter electrode via a first impedance.

10. Circuitry of claim 9, wherein the counter electrode is coupled to the second comparator input.

11. Circuitry of claim 9, further comprising a sample and hold circuit coupled between the comparator output and the first impedance.

12. Circuitry of claim 1, further comprising decoding circuitry configured to decimate the comparator output signal and output a data signal.

13. Circuitry of claim 12, wherein the decoding circuitry is further configured to determine the limit cycle frequency of the limit cycle period and output the limit cycle frequency or the limit cycle period to the control circuitry.

14. Circuitry of claim 1, wherein the control circuitry is further configured to estimate a load capacitance of the electrochemical cell based on the limit cycle frequency or the limit cycle period.

15. Circuitry of claim 1, wherein the electrochemical cell is configured to sense a plurality of different analytes.

16. Circuitry of claim 1, comprising bias circuitry for applying a bias voltage to the first comparator input, wherein the bias circuitry comprises a filter configured to receive an input voltage and generate the bias voltage.

17. Circuitry of claim 16, wherein the filter comprises an integrator having a first integrator input for receiving the input voltage, a second integrator input and an integrator output, wherein the integrator output is coupled to the first comparator input and to the first integrator input via a first capacitance, and wherein the second integrator input is coupled to the second comparator input.

18. Circuitry of claim 17, wherein the bias voltage is controlled to vary a limit cycle frequency of the comparator, wherein the limit cycle is controlled so as to provide an alternating current (AC) at the comparator output.

19. Circuitry of claim 1, further comprising hold circuitry configured to hold an electrode of the electrochemical cell at a predetermined voltage.

20. Circuitry of claim 1, wherein a polarity of the comparator is inverted on every other switching cycle of the comparator.

21. An electronic device, comprising the circuitry of claim 1.

22. The electronic device of claim 21, wherein the device comprises one of a continuous glucose monitor, a mobile computing device, a laptop computer, a tablet computer, a games console, a remote control device, a home automation controller or a domestic appliance, a toy, a robot, an audio player, a video player, or a mobile telephone, and a smartphone.

23. Circuitry for measuring a characteristic of an electrochemical cell comprising at least one working electrode and a counter electrode, the circuitry comprising:
  a hysteretic comparator having a first comparator input, a second comparator input and a comparator output coupled to the counter electrode via a first impedance;
  a feedback path between the comparator output and the second comparator input configured to provide a feedback signal to the second comparator input;
  a loop filter configured to apply filtering to the feedback path to generate the feedback signal, wherein the loop filter comprises the electrochemical cell; and
  a sample and hold circuit coupled between the comparator output and first impedance.

24. Circuitry for measuring a characteristic of an electrochemical cell comprising at least one working electrode, a counter electrode and a reference electrode, the circuitry comprising:
  a hysteretic comparator having a first comparator input, a second comparator input coupled to the reference electrode, and a comparator output coupled to the counter electrode;
  a feedback path between the comparator output and the second comparator input configured to provide a feedback signal to the second comparator input;
  a loop filter configured to apply filtering to the feedback path to generate the feedback signal, wherein the loop filter comprises the electrochemical cell; and
  an external capacitor coupled between the counter electrode and the working electrode.

25. Circuitry for measuring a characteristic of an electrochemical cell comprising at least one working electrode, a counter electrode, a reference electrode, and one or more additional counter electrodes, the circuitry comprising:
  a hysteretic comparator having a first comparator input, a second comparator input coupled to the reference electrode, and a comparator output coupled to the counter electrode;
  a feedback path between the comparator output and the second comparator input configured to provide a feedback signal to the second comparator input;
  a loop filter configured to apply filtering to the feedback path to generate the feedback signal, wherein the loop filter comprises the electrochemical cell; and
  a multiplexer configured to switchably coupled a reference voltage between the counter electrode or the working electrode and the one or more additional counter electrodes.

26. Circuitry for measuring a characteristic of an electrochemical cell, the circuitry comprising:
  a hysteretic comparator having a first comparator input, a second comparator input and a comparator output;
  a feedback path between the comparator output and the second comparator input configured to provide a feedback signal to the second comparator input; and
  a loop filter configured to apply filtering to the feedback path to generate the feedback signal, wherein the loop filter comprises the electrochemical cell,
  wherein the electrochemical cell is configured to sense a plurality of different analytes.

27. Circuitry for measuring a characteristic of an electrochemical cell, the circuitry comprising:
  a hysteretic comparator having a first comparator input, a second comparator input and a comparator output;
  a feedback path between the comparator output and the second comparator input configured to provide a feedback signal to the second comparator input;
  a loop filter configured to apply filtering to the feedback path to generate the feedback signal, wherein the loop filter comprises the electrochemical cell; and
  bias circuitry for applying a bias voltage to the first comparator input, wherein the bias circuitry comprises a filter configured to receive an input voltage and generate the bias voltage.

28. Circuitry for measuring a characteristic of an electrochemical cell, the circuitry comprising:
  a hysteretic comparator having a first comparator input, a second comparator input and a comparator output;
  a feedback path between the comparator output and the second comparator input configured to provide a feedback signal to the second comparator input; and
  a loop filter configured to apply filtering to the feedback path to generate the feedback signal, wherein the loop filter comprises the electrochemical cell,
  wherein a polarity of the comparator is inverted on every other switching cycle of the comparator.

* * * * *